United States Patent
Hettrich

(10) Patent No.: US 11,923,516 B2
(45) Date of Patent: Mar. 5, 2024

(54) ACTIVE AND PASSIVE BATTERY PRESSURE MANAGEMENT

(71) Applicant: QuantumScape Battery, Inc., San Jose, CA (US)

(72) Inventor: Kevin Hettrich, San Jose, CA (US)

(73) Assignee: QuantumScape Battery, Inc., San Jose, CA (US)

( * ) Notice: Subject to any disclaimer, the term of this patent is extended or adjusted under 35 U.S.C. 154(b) by 344 days.

(21) Appl. No.: 16/632,327

(22) PCT Filed: Nov. 28, 2017

(86) PCT No.: PCT/US2017/063526
§ 371 (c)(1),
(2) Date: Jan. 17, 2020

(87) PCT Pub. No.: WO2019/017994
PCT Pub. Date: Jan. 24, 2019

(65) Prior Publication Data
US 2020/0168959 A1    May 28, 2020

Related U.S. Application Data

(60) Provisional application No. 62/535,744, filed on Jul. 21, 2017.

(51) Int. Cl.
*H01M 10/44* (2006.01)
*G01R 31/392* (2019.01)
(Continued)

(52) U.S. Cl.
CPC ........ *H01M 10/445* (2013.01); *G01R 31/392* (2019.01); *H01M 10/0525* (2013.01);
(Continued)

(58) Field of Classification Search
CPC .. H01M 10/48; H01M 10/482; H01M 10/445; H01M 10/63; H01M 10/0525;
(Continued)

(56) References Cited

U.S. PATENT DOCUMENTS 3,895,959 A   7/1975  Dehmelt
3,895,962 A   7/1975  Mead
(Continued)

FOREIGN PATENT DOCUMENTS

WO   WO 2012/120782 A1   9/2012
WO   WO 2015/062235   *   5/2015   ............... H02H 7/18

OTHER PUBLICATIONS

Translation of WO 2015/062235, Zheng et al., "Electronic Device, Battery Protecting Method and Apparatus", May 7, 2015.*
(Continued)

*Primary Examiner* — Raymond Alejandro
(74) *Attorney, Agent, or Firm* — Squire Patton Boggs (US) LLP

(57) ABSTRACT

Provided herein are apparatuses and methods of useful for managing pressure in electrochemical devices. The methods and systems use inputs and combinations of inputs to predictively pressurize or depressurize a battery. The methods minimize energy losses from excessive battery pressure when the battery is not in use.

23 Claims, 5 Drawing Sheets

(51) Int. Cl.
   *H01M 10/0525* (2010.01)
   *H01M 10/48* (2006.01)
   *H01M 10/63* (2014.01)
   *H01M 50/209* (2021.01)
   *H01M 50/211* (2021.01)
   *H01M 50/264* (2021.01)

(52) U.S. Cl.
   CPC .......... *H01M 10/48* (2013.01); *H01M 10/63* (2015.04); *H01M 50/209* (2021.01); *H01M 50/211* (2021.01); *H01M 50/264* (2021.01); *H01M 2200/20* (2013.01); *H01M 2220/20* (2013.01)

(58) Field of Classification Search
   CPC .......... H01M 10/052; H01M 2200/20; H01M 2220/20; G01R 31/392; G01R 31/385
   See application file for complete search history.

(56) References Cited

U.S. PATENT DOCUMENTS

| | | |
|---|---|---|
| 4,146,682 A | 3/1979 | Nakao |
| 5,409,787 A | 4/1995 | Blanyer et al. |
| 5,618,641 A | 4/1997 | Arias |
| 5,648,714 A | 7/1997 | Eryou et al. |
| 5,725,967 A | 3/1998 | Tuttle |
| 5,800,939 A | 9/1998 | Mishina et al. |
| 5,929,597 A | 7/1999 | Pfeifer et al. |
| 6,040,085 A | 3/2000 | Cheu et al. |
| 6,087,036 A | 7/2000 | Rouillard et al. |
| 6,366,056 B1 | 4/2002 | Podrazhansky et al. |
| 6,797,018 B2 | 9/2004 | Rouillard et al. |
| 7,936,150 B2 | 5/2011 | Milios |
| 8,187,752 B2 | 5/2012 | Buckley et al. |
| 8,349,485 B2 | 1/2013 | Culver et al. |
| 8,460,819 B2 | 6/2013 | Fredriksson et al. |
| 8,481,204 B2 | 7/2013 | Hama et al. |
| 8,507,125 B2 | 8/2013 | Meschter |
| 9,761,861 B1 | 9/2017 | Holme et al. |
| 2003/0124433 A1 | 7/2003 | Kim et al. |
| 2004/0101759 A1 | 5/2004 | Okumura et al. |
| 2004/0142233 A1 | 7/2004 | Park et al. |
| 2004/0180263 A1 | 9/2004 | Kase et al. |
| 2004/0234865 A1 | 11/2004 | Sato et al. |
| 2005/0014036 A1 | 1/2005 | Kim |
| 2005/0248313 A1 | 11/2005 | Thorland |
| 2006/0068272 A1 | 3/2006 | Takami et al. |
| 2006/0216612 A1 | 9/2006 | Jambunathan et al. |
| 2007/0075682 A1 | 4/2007 | Guang et al. |
| 2007/0202400 A1 | 8/2007 | Yoshida et al. |
| 2007/0262746 A1 | 11/2007 | Kang et al. |
| 2008/0113336 A1 | 5/2008 | Dasgupta et al. |
| 2008/0124625 A1 | 5/2008 | Hock et al. |
| 2008/0176135 A1 | 7/2008 | Byun |
| 2008/0254343 A1 | 10/2008 | Kaplin et al. |
| 2009/0087723 A1 | 4/2009 | Inda |
| 2009/0173582 A1 | 7/2009 | Ogg |
| 2010/0035155 A1 | 2/2010 | Okada et al. |
| 2010/0190047 A1 | 7/2010 | West et al. |
| 2010/0233524 A1 | 9/2010 | Hina et al. |
| 2010/0259219 A1 | 10/2010 | Kurimoto et al. |
| 2010/0323244 A1 | 12/2010 | Chiang et al. |
| 2011/0052960 A1 | 3/2011 | Kwon et al. |
| 2011/0104532 A1 | 5/2011 | Buck et al. |
| 2012/0043924 A1 | 2/2012 | Sheahan |
| 2012/0183832 A1 | 7/2012 | Culver et al. |
| 2012/0207620 A1 | 8/2012 | Dalum et al. |
| 2012/0295142 A1 | 11/2012 | Yan et al. |
| 2012/0308869 A1 | 12/2012 | Obasih et al. |
| 2013/0004844 A1 | 1/2013 | Hosoe et al. |
| 2013/0026970 A1 | 1/2013 | Gale et al. |
| 2013/0043843 A1 | 2/2013 | Amiruddin et al. |
| 2013/0071718 A1 | 3/2013 | Cho et al. |
| 2013/0089769 A1 | 4/2013 | Proctor et al. |
| 2013/0143088 A1 | 6/2013 | Cho et al. |
| 2014/0028268 A1 | 1/2014 | Bourgeois et al. |
| 2014/0035531 A1 | 2/2014 | Garnier et al. |
| 2014/0091748 A1 | 4/2014 | Hermann |
| 2014/0093760 A1* | 4/2014 | Hermann .......... B60L 3/12 429/66 |
| 2014/0170468 A1 | 6/2014 | Sasaoka |
| 2014/0170493 A1 | 6/2014 | Holme et al. |
| 2014/0227568 A1 | 8/2014 | Hermann |
| 2014/0272564 A1 | 9/2014 | Holme et al. |
| 2015/0054460 A1* | 2/2015 | Epstein .......... B60L 53/53 320/109 |
| 2017/0155256 A1 | 6/2017 | Fujimaki et al. |
| 2018/0330844 A1 | 11/2018 | Aetukuri et al. |

OTHER PUBLICATIONS

International Search report and Written opinion of PCT/US2017/063526 dated Jun. 6, 2018, 21 pages.

Buttol et al., "The Electrochemical Characteristics Of A Polydithienothiophene Electrode In Lithium Cells", Electrochimica Acta, 1986, vol. 31, No. 7, pp. 783-788.

Choi et al., "Li-ion batteries from LiFePO$_4$ cathode and anatase/graphene composite anode for stationary energy storage", Electrochemistry Communications 12, 2010, pp. 378-381.

Fey et al., "LiNiVO$_4$: A 4.8 Volt Electrode Material for Lithium Cells", J. Electrochem. Soc., Sep. 1994, vol. 141, No. 9, pp. 2279-2281.

Gu et al. "Lithium-Iron Fluoride Battery with In Situ Surface Protection" Advanced Functional Materials, 2016, DOI:10.1002/adfm.201504848, pp. 1-10.

Heredy et al., "Metal Sulfide Electrodes for Secondary Lithium Batteries", In New Uses of Sulfur; West, J.; Advances in Chemistry; American Chemical Society: Washington, DC, 1975, pp. 203-215.

Larsson et al., "An ab initio study of the Li-ion battery cathode material Li$_2$FeSiO$_4$", Electrochemistry Communications 8, 2006, pp. 797-800.

Linden and Reddy, Handbook of Batteries, 2001, McGraw-Hill, Third Edition.

Wang et al., "Conversion Reaction Mechanisms in Lithium Ion Batteries: Study of the Binary Metal Fluoride Electrodes", Journal of the American Chemical Society, Sep. 6, 2011, vol. 133, pp. 18828-18836.

* cited by examiner

ACTIVE AND PASSIVE BATTERY PRESSURE MANAGEMENT

CROSS-REFERENCE TO RELATED APPLICATIONS

This application is a National Stage of International Application No. PCT/US2017/063526, filed on Nov. 28, 2017, and published as WO 2019/017994 on Jan. 24, 2019, and entitled "ACTIVE AND PASSIVE BATTERY PRESSURE MANAGEMENT," which claims priority to, and the benefit of, U.S. Patent Application No. 62/535,744, filed Jul. 21, 2017, and entitled "ACTIVE AND PASSIVE BATTERY PRESSURE MANAGEMENT," the contents of each of which are incorporated herein by reference in their entirety for all purposes.

FIELD

This disclosure is generally related to battery control systems and management systems, as well as systems comprising electrochemical cell(s), rechargeable batteries, rechargeable battery modules, and rechargeable battery packs.

BACKGROUND

Lithium metal anodes in a rechargeable battery have significant volume changes during the charge and discharge cycles. When such anodes are paired with solid electrolytes (e.g., $LiBH_4 \cdot LiI$, $LiOCl$, $Li_7La_3Zr_2O_{12}$, and $Li_{10}GeP_2S_{12}$), the resulting solid-state rechargeable batteries benefit from being deployed with devices and mechanisms that can accommodate these volume and corresponding pressure changes, else the anode, solid electrolyte, as well as cathode, can delaminate and lead to a reduction in performance, or worse still, a catastrophic failure. Similarly, excessive or insufficient pressure can damage electrochemical cell(s) and result in a reduction in capacity, an increase in impedance, or safety event. Accordingly, what is needed are systems and methods for appropriately pressurizing, as well as de-pressurizing, solid-state rechargeable batteries.

SUMMARY

Disclosed herein are novel and inventive systems, apparatuses, and methods useful for managing pressure in a rechargeable battery. The instant disclosure sets forth methods and systems using novel inputs and combinations of inputs to pressurize or depressurize a battery. In some examples, the methods are predictive. In some examples, the methods are performed in reaction to certain input data or measured condition. The instant disclosure sets forth methods and systems using novel inputs and combinations of inputs to predictively pressurize or depressurize a battery. The instant disclosure sets forth methods and systems for managing battery pressure before an expected drive. In some examples, the methods minimize energy losses from excessive battery pressure when the battery is not in use.

The instant disclosure sets forth methods, systems, and apparatuses for pressurizing and depressurizing a lithium secondary battery so that the battery has a predetermined performance at the time that it is actually used in an electric vehicle and without using more energy from the battery than is necessary to achieve this predetermined performance. The instant disclosure sets forth methods, systems, and apparatuses for pressurizing or depressurizing a lithium secondary battery so that the battery has a predetermined performance at the time that it is actually used in an electric vehicle, and using the minimum amount of energy from the battery necessary to achieve this predetermined performance. In a number of embodiments, dynamic pressurization or depressurization techniques may be used.

In one embodiment, disclosed herein is a battery module wherein the battery module has a housing including a compressible fluid and at least one electrochemical cell, wherein the at least one electrochemical cell is in a flexible pouch or can cell; wherein the at least one electrochemical cell includes a lithium (Li) metal negative electrode, a thin film solid-state electrolyte, and a positive electrode; wherein the thin film solid-state electrolyte has a thickness from 10 nm to 100 µm; wherein the compressible fluid is between and in contact with the housing and either the flexible pouch or can cell; and wherein the compressible fluid maintains an isostatic pressure on the electrochemical cell.

In another embodiment, disclosed herein is a battery module housing including or containing at least one prismatic pouch or can cell including at least one electrochemical cell wherein the electrochemical cell includes a Li-metal negative electrode, a thin film solid-state separator electrolyte, and a positive electrode. The battery module housing further includes at least one member selected from the group consisting of a pressure sensor and a compressible element. The at least one member selected from the group consisting of a pressure sensor and a compressible element is between the inner wall of the housing and the outer wall of at least one of the at least one prismatic pouch or can cell. The at least one member selected from the group consisting of a pressure sensor and a compressible element is in electrical communication with at least one controller configured to monitor the pressure sensor or to actuate the compressible element, or both to monitor the pressure sensor and to actuate the compressible element. The compressible element applies an isostatic pressure to the solid-state separator electrolyte in the electrochemical cell.

In another embodiment, disclosed herein is a container including at least one battery module, wherein each battery module includes one or more electrochemical cells each comprising a lithium metal negative electrode or a thin film solid-state separator electrolyte, or both, at least one member selected from the group consisting of a pressure sensor or a compressible element, wherein the compressible element is a gas, liquid, or both a gas and a liquid, and at least one controller. The at least one member selected from the group consisting of a pressure sensor and compressible element is between the inner wall of the container and the outer wall of the one or more battery cells. The at least one member selected from the group consisting of a pressure sensor and compressible element is in electrical communication with the at least one controller. The at least one member selected from the group consisting of a pressure sensor and compressible element is configured to monitor the pressure sensor or to modulate the compressible element, or both to monitor the pressure sensor and to modulate the compressible element to maintain an isostatic pressure on the one or more battery cells.

In another embodiment, disclosed herein is a method for pressurizing or de-pressurizing a battery system including the following steps: providing a battery system including one or more stacks of electrochemical cells, each electrochemical cell having a positive electrode, a lithium metal negative electrode, and solid-state electrolyte; determining a condition by sensing pressure of the battery cell; calculating a current state of health (SOH) for the battery system based on the condition and battery metrics; providing one or more comparison values; and comparing the one or more comparison values to the current state of health to provide a comparison result; and determining if a safety condition exists based on the SOH relative to the comparison values; applying a first pressure to the battery system if the comparison result is normal; applying a second pressure if the comparison result is not normal and no safety conditions exist; applying a third pressure if the comparison result is not normal and no safety condition exists, and maintenance is required; or de-pressurizing the battery system if the comparison result is not normal and a safety condition exists.

In another embodiment, disclosed herein is a method for shipping a battery system including the following steps: providing a battery system having one or more electrochemical stacks of electrochemical cells, each electrochemical cell including a positive electrode, a lithium metal negative electrode, and solid-state separator electrolyte. The battery system further including at least one member selected from the group consisting of a pressure sensor and a compressible element, and at least one controller. The method further including depressurizing the battery system, and shipping the battery system, wherein the member selected from the group consisting of a pressure sensor and a compressible element is between the housing and one of the one or more electrochemical cells; and wherein the at least one controller is in electrical communication with both the pressure sensor and the compressible element.

In another embodiment, disclosed herein is a method for shipping a battery system including the following steps: providing a battery system including a housing, one or more stacks of electrochemical cells, each electrochemical cell including a positive electrode, a lithium metal negative electrode, and solid-state separator electrolyte; at least one member selected from the group consisting of a pressure sensor and a compressible element; and at least one controller; depressurizing the battery system; and shipping the battery system. The member selected from the group consisting of a pressure sensor and a compressible element is between the housing and one of the one or more electrochemical cells. The at least one controller is in electrical communication with both the pressure sensor and the compressible element.

In another embodiment, disclosed herein is a method for maintaining a battery system including the following steps: providing a battery system including one or more stacks of electrochemical cells, each electrochemical cell comprising a positive electrode, a lithium metal negative electrode, and a solid-state separator electrolyte, at least one member selected from the group consisting of a pressure sensor and a compressible element, and at least one controller; depressurizing the battery system; and repairing the battery system. The repairing the battery system includes the steps of: determining a condition by sensing pressure of the battery cell; calculating a current state of health (SOH) for the battery system based on the condition and battery metrics; providing one or more comparison values; comparing the one or more comparison values to the current SOH to provide a comparison result; and adjusting the pressure in the battery system to meet battery specifications at the time of manufacture.

In another embodiment, disclosed herein is a method for maintaining a battery system having the following steps: providing a battery system comprising one or more electrochemical stack of electrochemical cells, each electrochemical cell comprising a positive electrode, a lithium metal negative electrode, and a solid-state separator electrolyte. The battery system further including at least one member selected from the group consisting of a pressure sensor and a compressible element, and at least one controller. The method further including depressurizing the battery system and repairing the battery system, wherein the repairing of the battery system includes the steps of: determining a condition by sensing pressure of the battery cell, calculating a current state of health (SOH) for the battery system based on the condition and battery metrics, providing one or more comparison values, comparing the one or more comparison values to the current state of health to provide a comparison result, and adjusting the pressure in the battery system to meet battery specifications at the time of manufacture.

In another embodiment, disclosed herein is a method for secondary battery pressure management in a vehicle, the method including using input parameters; predicting a plurality of performance requirements for a battery of the vehicle using a respective plurality of sets of values for the input parameters and a weighting factor assigned to each of the input parameters, where for at least one of the predicted performance requirements, sending a control signal to a dynamic compressible element for modifying a pressurization of the battery according to the at least one of the predicted performance requirements; logging a plurality of actual performance requirements; and refining a predictive capability for battery performance requirements including, for each actual performance requirement, modifying the weighting factors assigned to the input parameters as a function of the respective actual performance requirement and predicted performance requirement.

BRIEF DESCRIPTIONS OF THE DRAWING

DETAILED DESCRIPTION

Figure 1:
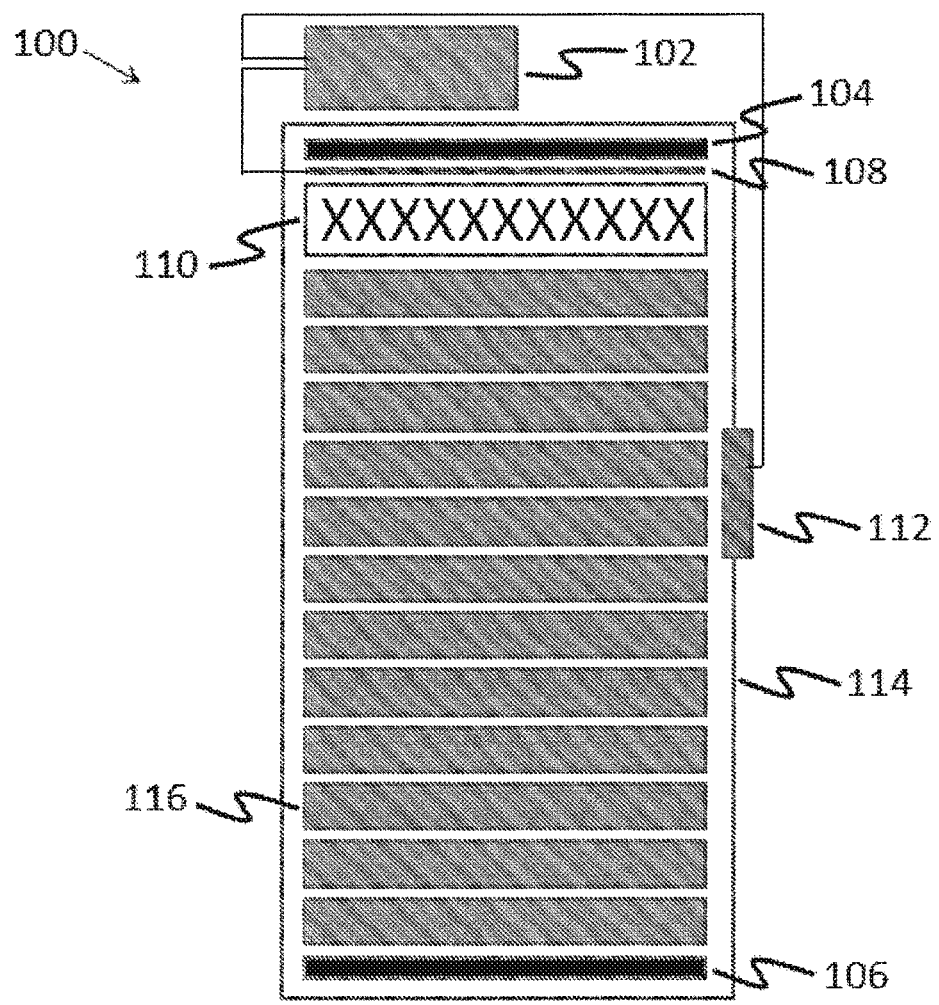
FIG. 1 shows one embodiment of an end plate and strap compression apparatus.

The following description is presented to enable one of ordinary skill in the art to make and use the inventions set forth herein and to incorporate these inventions in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

Furthermore, any element in a claim that does not explicitly state "means for" performing a specified function, or "step for" performing a specific function, is not to be interpreted as a "means" or "step" clause as specified in 35 U.S.C. Section 112 (f). In particular, the use of "step of" or "act of" in the claims herein is not intended to invoke the provisions of 35 U.S.C. 112 (f).

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

A. DEFINITIONS

As used herein, the term "abnormal" refers to a state of the battery as a function of, but not limited to, open-circuit voltage (OCV), resistance, impedance, capacity, temperature, calendar life, pressure, and historical use, any of which are associated with the battery performing with at least a 20% degradation in the manufacturer's rated metric. For example, abnormal may refer to a value outside a range of pre-determined values assigned to a particular battery health metric. For example, if a battery is rated by its manufacturer to have a capacity of 100 Amp-hrs at 80° C. (e.g., specifying a state of health of 100%) when fully charged, then an abnormal state will include an OCV, resistance, impedance, capacity, temperature, calendar life, pressure, and/or historical use that is associated with less than 80 Amp-hrs at 80° C. (e.g., defining a state of health of 0%) when the battery is fully charged. For example, if a battery is rated by its manufacturer to have a power density of 1000 W/L at 80° C., then an abnormal state will include an OCV, resistance, impedance, capacity, temperature, calendar life, and/or historical use that is associated with 800 W/L or less at 80° C. For example, if a battery is rated by its manufacturer to have an energy density of 1000 kWh/L at 80° C., then an abnormal state will include an OCV, resistance, impedance, capacity, temperature, calendar life, and/or historical use that is associated with 800 kWh/L or less at 80° C.

As used herein, the term "normal" refers to a state of the battery as a function of, but not limited to, OCV, resistance, capacity, temperature, calendar life, pressure and/or historical use. For example, normal may refer to a value within a range of pre-determined values assigned to a particular battery health metric. For example, if a battery is rated by its manufacturer to have a power rate of 100 Amp-hrs at 80° C. (e.g., specifying a state of health of 100%) when fully charged, then a normal state will include an OCV, resistance, impedance, capacity, temperature, calendar life, pressure and/or historical use that is associated with 80 Amp-hrs or more at 80° C. (e.g., defining a state of health of 0%) when the battery is fully charged.

As used herein, the term "battery" refers to an electrochemical device or an energy storage device—such as, but not limited to—a Li-secondary battery that operates or produces electricity or an electrical current by an electrochemical reaction.

As used herein, the phrases "electrochemical cell" or "battery cell" shall mean a single cell including a positive electrode and a negative electrode, which have ionic communication between the two using an electrolyte. In some embodiments, the same battery cell includes multiple positive electrodes and/or multiple negative electrodes enclosed in one container. In some embodiments, the electrochemical cells are stacked in series to produce a stack of electrochemical cells. In some embodiments, the electrochemical cells are stacked in parallel to produce a stack of electrochemical cells. In some embodiments, the electrochemical cells are stacked wherein two or more electrochemical cells share one electrolyte. In some embodiments, the electrochemical cells are stacked wherein two or more electrochemical cells share one solid-state electrolyte (e.g., garnet $Li_7La_3Zr_2O_{12}$ or $Li_2S$—$LiSi_2$).

As used herein, the terms "positive electrode" and "negative electrode" refer to the electrodes of a battery. During a charge cycle in a Li-secondary battery, Li ions leave the positive electrode and move through an electrolyte, to the negative electrode. During a charge cycle, electrons leave the positive electrode and move through an external circuit to the negative electrode. During a discharge cycle in a Li-secondary battery, Li ions migrate towards the positive electrode through an electrolyte and from the negative electrode. During a discharge cycle, electrons leave the negative electrode and move through an external circuit to the positive electrode.

As used herein, the phrase "electrochemical stack," refers to one or more units which each include at least a negative electrode (e.g., Li, $LiC_6$), a positive electrode (e.g., Li-nickel-manganese-oxide or $FeF_3$, optionally combined with a solid-state electrolyte or a gel electrolyte), and a solid electrolyte (e.g., an oxide electrolyte set forth herein) between and in contact with the positive and negative electrodes. In some examples, between the solid electrolyte and the positive electrode, there is an additional layer comprising a gel electrolyte. An electrochemical stack may include one of these aforementioned units. In some examples, two more electrochemical cells share an electrolyte. An electrochemical stack may include several of these aforementioned units arranged in electrical communication (e.g., serial or parallel electrical connection). In some examples, when the electrochemical stack includes several units, the units are layered or laminated together in a column. In some examples, when the electrochemical stack includes several units, the units are layered or laminated together in an array. In some examples, when the electrochemical stack includes several units, the stacks are arranged such that one negative electrode is shared with two or more positive electrodes. Alternatively, in some examples, when the electrochemical stack includes several units, the stacks are arranged such that one positive electrode is shared with two or more negative electrodes. Unless specified otherwise, an electrochemical stack includes one positive electrode, one solid electrolyte, and one negative electrode, and optionally includes a gel electrolyte layer between the positive electrode and the solid electrolyte.

As used herein, the term "electrolyte," refers to an ionically conductive and electrically insulating material. Electrolytes are useful for electrically insulating the positive and negative electrodes of a secondary battery while allowing for the conduction of ions, e.g., $Li^+$, through the electrolyte. In some of the electrochemical devices described herein, the electrolyte includes a solid film, pellet, or monolith of a $Li^+$ conducting oxide, such as a lithium-stuffed garnet, an Li—P—S—X (X=Cl, Br, I) compound, an antiperovskite compound, an $LiBH_4$—$LiNH_2$—LiX (X=Cl, Br, I) compound, or other compounds known in the art. In some examples, the electrolyte further includes a gel electrolyte which is laminated to or directly contacting the solid film, pellet, or monolith. In some examples, the electrolyte may be a composite material of a solid and a polymer, as described in U.S. Patent Application Publication No. U.S. 2017/0005367 which published Jan. 5, 2017 and was filed Jun. 24, 2016 as Ser. No. 15/192,960 entitled "COMPOSITE ELECTROLYTES," which is incorporated by reference herein in its entirety. As used herein, the phrase "lithium stuffed garnet" refers to oxides that are characterized by a crystal structure related to a garnet crystal structure. U.S. Patent Application Publication No. U.S. 2015/0099190, which published Apr. 9, 2015 and was filed Oct. 7, 2014 as Ser. No. 14/509,029 entitled "GARNET MATERIALS FOR LI SECONDARY BATTERIES AND METHODS OF MAKING AND USING GARNET MATERIALS," is incorporated by reference herein in its entirety. U.S. Patent Application Publication No. U.S. 2014/0113187, which published Apr. 24, 2014 and was filed Oct. 23, 2013 as Ser. No. 14/060,618 entitled "METHOD FOR FORMING AND PROCESSING ANTI-PEROVSKITE MATERIAL DOPED WITH ALUMINUM MATERIAL" is incorporated by reference herein in its entirety.

As used herein, the phrase "active battery pressure management," refers to a system comprising an actuator that modulates the pressure of the battery cell(s), stack, module, or pack, a controller that controls the actuator via a closed-loop feedback, a pressure sensor, and optionally, battery sensors.

As used herein, the phrase "passive battery pressure management," refers to a system comprising a spring or other device that applies pressure to the battery cell(s), stack, module, or pack, which does not have closed-loop feedback.

As used herein, the phrase "comparison result" refers to the output or readout from a comparison of a measured value and one or more comparison values. For example, an initial comparison value may be a temperature of 80 to 85° C.; a measured comparison value may be 82.5° C. The comparison result would then be, for example, the difference between the measured comparison value and the initial comparison value (e.g., the absolute value of the difference). For example, the comparison result may be ±2.5° C.

As used herein, the phrase "comparison values" refer to data values collected from the sensors within a battery system. For example, a comparison value may include, without limitation, a temperature value at $t_0$ or at the time of a particular event; a first measured temperature; or a second measured temperature value, each of the first and second temperatures being measured at a subsequent time or event.

As used herein, the term "compressible element" refers to an element that includes the capacity to contract and/or expand. For example, a compressible element may include, without limitation, a balloon configured to contract upon being exposed to an external pressure. A compressible element may include a passive spring or a spring which can be actively actuated (e.g., coil or helical). A compressible element may include a compressible material, such as but not limited to, a rubber, hardened rubber, foam, or plastic configured to contract and/or expand. A compressible element may include a welded metal (e.g., mylar), and a spring leaf configured to contract and/or expand. A compressible element may include a bladder filled with a gas, liquid, sublimating liquid, or combination thereof, where the bladder is configured to contract and/or expand. Alternatively, the same balloon may be configured to expand and exert a pressure upon another material. A compressible element may include a gas or a gas/liquid mixture. A compressible element may include, but is not limited to, those compressible elements set forth in U.S. patent application Ser. No. 14/038,771, entitled BATTERY CONTROL SYSTEMS, filed Sep. 27, 2013, the entire contents of which are herein incorporated by reference in its entirety for all purposes.

As used herein, the term "controller" refers to hardware or a device that includes, without limitation, a processor, a memory, a communications interface, and programmable logic or software. The controller may be configured to execute software; or activate/enable or deactivate/disable electrical current based on inputs received from other hardware, for example, from one device to another device; or activate/enable or deactivate/disable.

As used herein, the phrase "control message" refers to an information request or transmission, and may contain or have a field indicating instructions to a terminal to execute a function. For example, a control message may contain, without limitation, a message having information that may be used to determine whether cached comparison values should be updated or refreshed.

As used herein, the term "dynamic" refers to more than one pressurization or depressurization steps or conditions, a pressurization or depressurization step having varied pressure settings throughout the pressurization or depressurization step(s), more than one pressurization or depressurization step wherein at least two pressurization or depressurization steps are of different durations (i.e., time) and pressures, a series of pressurization or depressurization steps at either or both different pressure settings or pressurization/depressurization durations, or combinations thereof "Dynamic" is also used herein to refer to a physical material which can bend, flex, or change shape, passively or actively.

As used herein, the phrase "pressure input" refers to a value or data corresponding to a pressure readout from a pressure sensor.

As used herein, the term "pressure sensor" refers to a device for measuring the pressure or operating pressure of a gas or fluid in a vessel or container. A pressure sensor includes, for example, a sensor such as a piezoresistive strain gauge, a capacitive pressure sensor, an electromagnetic pressure sensor, or other commercially available pressure sensors. Exemplary commercially available sensors include, without limitation, Honeywell Model S or G subminiature flush diaphragm pressure transducer; Honeywell Model F subminiature, low profile pressure transducer; Rexroth (Bosch Group) HM20 pressure transducer; Sensata Automotive Microfused Silicon Strain Gauge (MSG); Sensata solid-state capacitive Automotive Pressure Sensor (APT); Futek fatigue rated low profile universal pancake cell; and Futek load button load cell. Selection of any sensor is dependent on pressure system design. For example, in one embodiment, the Rexroth (Bosch Group) HM20 pressure transducer is appropriate for fluid based pressure systems. Other pressure sensor selections for other pressure systems have been contemplated.

As used herein, the term "prismatic" refers to a type of battery packaging such as a metal can cell or a prismatic (stacked) pouch cell.

A pouch cell battery includes a soft, flexible pouch or bag into which one or more electrochemical stacks are positioned and hermetically sealed. Exemplary pouch materials include, without limitation, aluminum laminated films, for example, as provided commercially by Showa Denko. Selection of components in the aluminum laminated films depend on, for example, engineering requirements. Accordingly, exemplary laminates include, without limitation, dry versus heat laminates. For example, in one embodiment, heat laminates are common for electric vehicle (EV) pouch cells. Other common laminate layers include, without limitation, nylon, aluminum foil inner layer, cast polypropylene (PP), cast polyethylene (PE), and cast polyethylene terephthalate (PET). Exemplary thicknesses of the aluminum laminates include, without limitation, ranges between 70-160 um; and forming depths of 4-9 mm. A metal can cell encloses the electrochemical stack in a metal such as aluminum or steel. Exemplary metal can materials include, without limitation, steel or aluminum, for example, as provided commercially by Fuji Springs Co. The electrochemical stack may be stacked, z-wound, wound, or assembled in other structures. Electrical leads to the hermetically sealed electrochemical stack extend through the pouch or metal can. Exemplary commercially available pouches include, without limitation, Showa Denko and Targray pouches.

As used herein, the term "program" or "programmed" refers to a set of software instructions stored in the memory of hardware to execute a set of functions on data objects or comparison value(s) stored in the memory.

As used herein, the phrase "safe-message instruction" refers to a set of instructions communicated to or from a driver or battery controller or battery management systems and which relates to a safety condition.

As used herein, the phrase "safety condition" refers to a condition that involves a potential hazardous condition(s) such as a catastrophic failure of the battery or thermal runaway.

As used herein, the phrase "SOC" refers to a battery state-of-charge as a percentage of full charge. When a battery is fully charged, its SOC is 100%; when a battery is fully discharged, its SOC is 0%; when a battery is half-charged, its SOC is 50%. SOC may be determined by measuring charge passed over time, voltage, voltage hysteresis, impedance, temperature, pressure, or any other metric, which is indicative of the SOC. A "previous SOC" includes a state of charge at an immediately prior or otherwise previous time interval.

As used herein, the phrase "static enclosure" refers to an enclosure that does not expand or contract by more than 5% in any linear dimension under environmental or internal pressures encountered during normal operation.

As used herein, the phrase "tension element" refers to a material having the capacity to expand or contract depending upon an external or internal condition. For example, a tension element may include a rubber band.

As used herein, the phrase "full charge," refers to an electrochemical cell having a 100% state-of-charge (SOC). As used herein, the phrase "less than a full charge," refers to an electrochemical cell having a SOC less than 100%. Full charge may be relative to a rated or nameplate capacity of the battery when measured at beginning of life at a specified rate and temperature.

As used herein, the term "charging," or the phrase "charging the electrochemical cell," unless specified otherwise to the contrary, refers to a process whereby energy is applied to an electrochemical cell in order to increase its SOC. Charging typically involves applying a high voltage to the battery in a polarity that causes positive ions to flow from the positive electrode to the negative electrode.

As used herein, the term "module" refers to a computer, a programmed chip, a battery management system, a controller in series with a potentiostat, a controller in series with a compressible element, a controller in series with a thermocouple, a resistive heater, a computer or electronic device which controls a compressible element, a computer or electronic device which controls a resistive heater, an inductive heater, a computer or electronic device which controls an inductive heater, a convective heater, a computer or electronic device which controls a convective heater, or similar devices for heating a battery or the area or space in which a battery is housed.

As used herein, the term "housing" refers to an enclosure or container for an electrochemical cell or stack, or battery cell or stack, and other components of an electrochemical device.

As used herein, the phrase "electrical communication" refers to the juxtaposition of two materials such that the two materials contact each other sufficiently to conduct either an ion or electron current. As used herein, direct contact may also refer to two materials in contact with each other and which do not have any other different types of solid or liquid materials positioned between the two materials, which are in direct contact.

As used herein, the phrase "a face of one of the one or more battery cells" refers to at least one face of a three-dimensional battery cell. The three-dimensional battery cell can be any number of three-dimensional shapes including, but not limited to, a trapezoid, a parallelogram, a triangle, a diamond, and an oval. For example, a three-dimensional parallelogram is a parallelepiped or rhomboid structure formed by six parallelograms. Accordingly, each side of the parallelepiped is a face of the parallelepiped.

As used herein, the phrase "actuated compressible element" refers to a compressible element that includes the capacity to contract and/or expand in response to an actuator element that applies pressure to the compressible element. For example, in one embodiment, when the compressible element is a spring, actuation is accomplished, for example, by increasing or decreasing tension of a steel strap that wraps the battery stack(s) using a screw-driven actuator.

As used herein, the phrase "dynamic compressible element" refers to a compressible element that includes the capacity to contract and/or expand in response to a signal from a dynamic controller. For example, a dynamic compressible element such as a piezoelectric actuator may be used.

As used herein, the phrase "calculating a current SOH comprises factoring in an existing pressure" refers to the procedure of determining the current cell life via a pressure or length measurement. For example, if a battery develops pressure during life at 2% per year of calendar ageing under specified temperature and voltage conditions, then measurement of the pressure in the battery cell of 8% above the beginning-of-life value may be used to assess the current SOH as equivalent to 4 years of calendar ageing.

As used herein, the phrase "non-safe" refers to a battery condition known to present a higher risk of safety event. The condition may include, for example, over- or under-voltage, over- or under-charge, over temperature, over- or under-pressurized, below a known safe value of impedance or Coulombic efficiency, and the like.

As used herein, the phrase "safe" refers to a battery condition known to present low risk of safety events. It may include the battery at near-nominal voltage, capacity, temperature, impedance, and pressure.

As used herein, the term "contactors" refers to high voltage connections between a battery system and an apparatus that can be either connected or disconnected, as would be appreciated by a person skilled in the art.

As used herein, the term "drone" refers to an unmanned aerial vehicles (UAV), autonomous aerial vehicles (AAV), semi-autonomous aerial vehicles (SAAV, e.g., Google cars in mountain view with a human ready to take control, if necessary), an unmanned ground vehicle (UGV), autonomous ground vehicle (AGV), semi-autonomous ground vehicle (SAGV), or other types of drones, including micro-implementations such as micro unmanned aerial vehicles and micro unmanned ground vehicles, whose operation is controlled autonomously and/or by a remote pilot or driver.

As used herein, the term "driver" refers to human or computer-controlled operators of transportation vehicles or drones.

B. GENERAL EMBODIMENTS

An important component of electrical vehicles is the secondary battery system, which provides power to the vehicle and determines vehicle performance. In many applications, this battery is a lithium secondary battery, for example, a solid-state lithium secondary battery. Secondary batteries, as opposed to primary batteries, are rechargeable. Lithium ion and lithium metal batteries are useful in automotive applications because of their high specific energy and energy density, long cycle life, high round-trip efficiency, low self-discharge, and long shelf life. However, some of these batteries exhibit poor management of pressure within the secondary battery system.

Furthermore, some next-generation battery technologies and designs are moving in the direction of improving energy density, but may have lower power availability at certain battery system pressures. Such next-generation batteries may need to be pressurized or depressurized to provide full or optimal power over the life of the battery system.

One strategy to increase battery performance as a function of pressure includes pressurizing or depressurizing the battery system before use of the battery or after use of the battery, respectively. As battery pressure increases when the battery is not in use (e.g., while the battery is charging), battery performance may degrade over time. Depressurizing the battery when the battery is not in use increases the power available over the lifetime of the battery, especially when the vehicle/battery is not being used.

Referring to the Drawing, FIG. 1 shows one embodiment of an apparatus generally designated 100. The apparatus 100 may include at least one controller 102, a housing 114, a first endplate 104 and a second endplate 106, a pressure sensor 108, a compressible element 110, a tension element 112, conductive tabs (not illustrated), and one or more battery cells 116 (collectively referred to as a stack). In this embodiment, the first endplate 104 may be positioned opposite to and parallel with the second endplate 106. The first endplate 104 may further include opposing inner and outer surfaces; and the second endplate 106 may also include opposing inner and outer surfaces. The housing 114 may include a first end and an opposing second end. The first endplate outer surface may be adjacent to the first end of the housing 114, and the second endplate outer surface may be adjacent to the second end of the housing 114. The tension element 112 includes a length that may be orthogonal to the first and second end plates and further includes a first endpoint and an opposing second endpoint at the opposite ends of the length. The one or more battery cells 116 may be generally located between the inner surfaces of both the first and the second endplates. The compressible element 110 may be located between the inner surface of the first end plate and the one or more battery cells 116, and the pressure sensor 108 may be located between the compressible element 110 and the inner surface of the first end plate. The housing 114 may be generally configured to enclose each of the first and second end plates 104, 106 that contain the one or more battery cells 116, and the one or more battery cells 116 (i.e., laterally). Further, in this embodiment, the housing 114 includes the tension element 112, where the first and second endpoints of the tension element are attached to the housing 114. Lastly, the at least one controller 102 may be connected to the pressure sensor 108 and the tension element 112.

Figure 2:
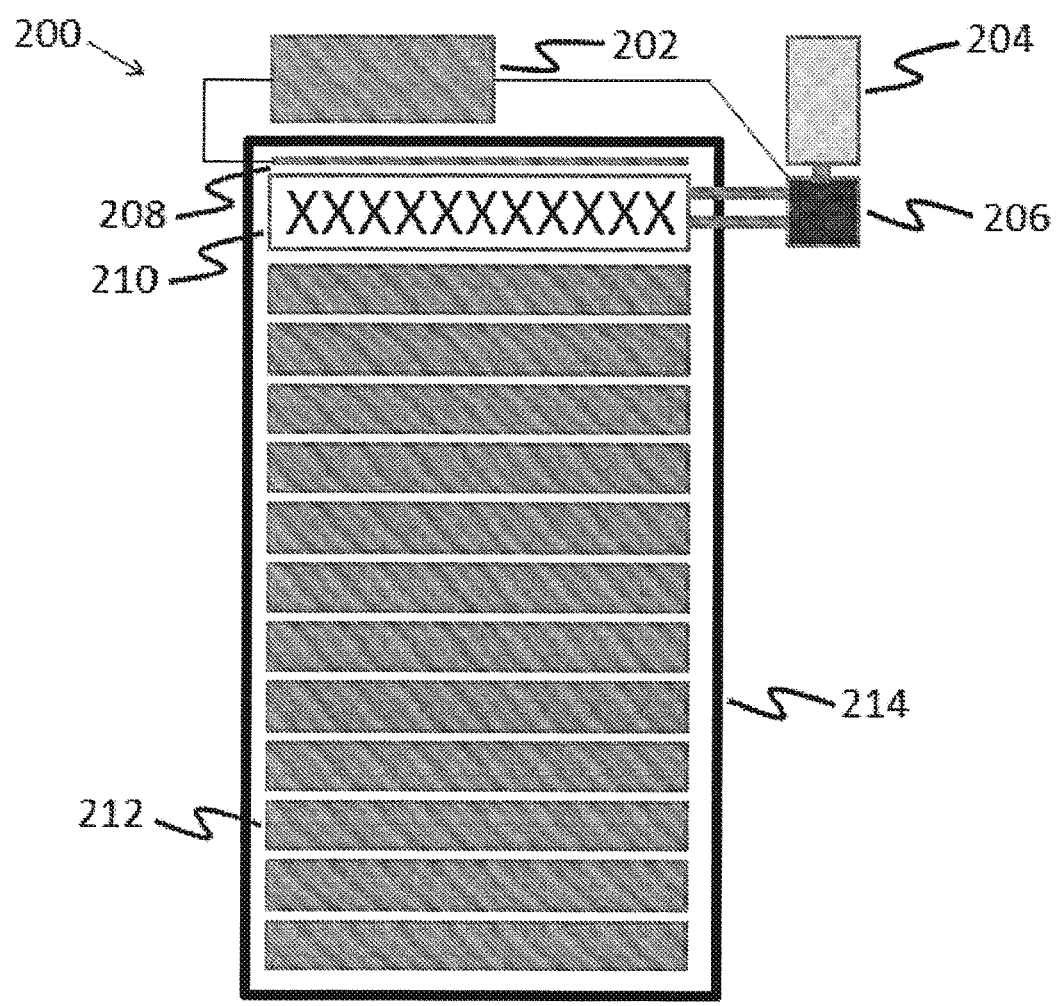
FIG. 2 shows one embodiment of a fluid-controlled compression apparatus.

Now referring to FIG. 2, shown is another embodiment of an apparatus generally designated 200. The apparatus 200 may include at least one controller 202, a housing 214, a pressure sensor 208, a compressible element 210, one or more battery cells 212, a fluid reservoir 204, conductive tabs (not illustrated), and a pump 206. In this embodiment, the housing 214 may also include a first end and an opposing second end, as in FIG. 1. The one or more battery cells 212 may be generally located within the housing, and more specifically, between the first and second ends of the housing. The compressible element 210 may be located between the one or more battery cells 212 and the first end of the housing, and the pressure sensor 208 may be located between the compressible element 210 and first end of the housing. The housing 214 may be generally configured to enclose each of the one or more battery cells 212, the pressure sensor 208, and the compressible element 210. The fluid reservoir 204 is connected to the pump 206. Lastly, the at least one controller 202 may be connected to the pump 206 and the pressure sensor 208.

Figure 3:
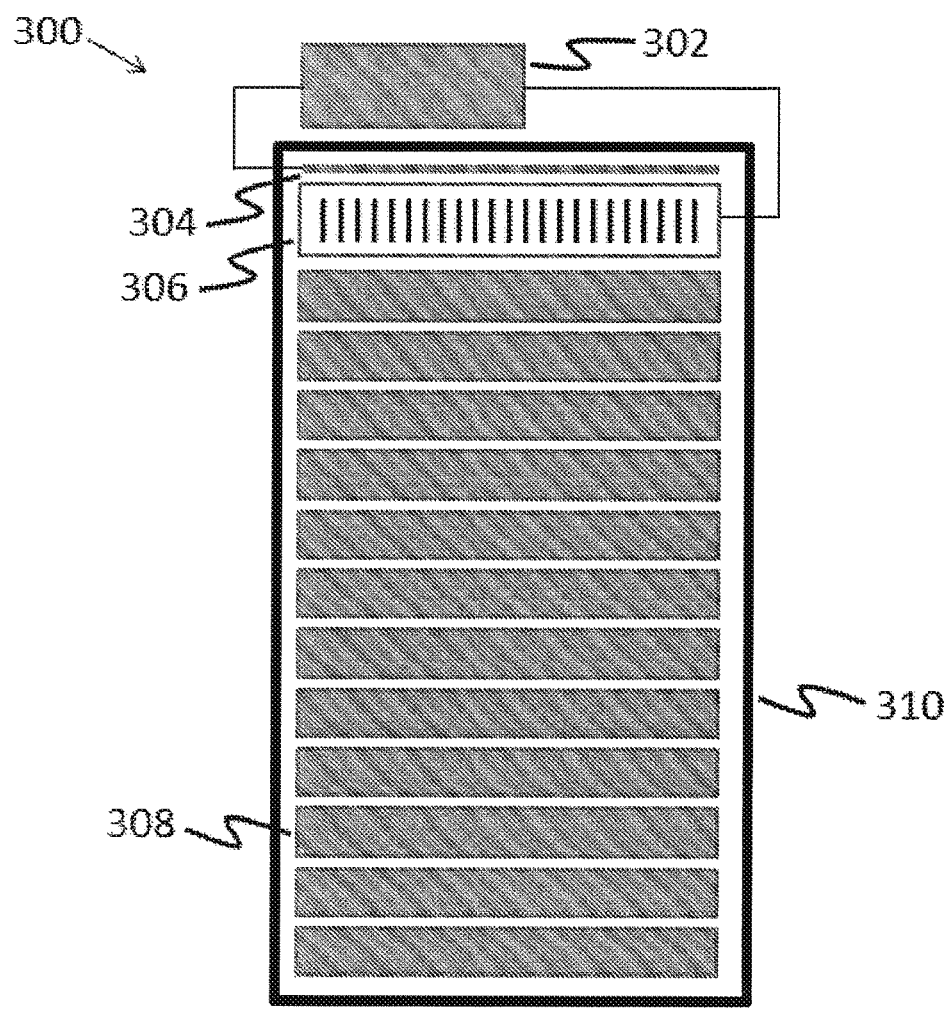
FIG. 3 shows one embodiment of a piezoelectric compression apparatus.

Referring now to FIG. 3, shown is another embodiment of an apparatus generally designated 300. The apparatus 300 may include at least one controller 302, a housing 310, a pressure sensor 304, a compressible element 306, conductive tabs (not illustrated), and one or more battery cells 308. In this embodiment, the housing 310 may also include a first end and an opposing second end, as in FIGS. 1 and 2. The one or more battery cells 308 may be generally located within the housing, and more specifically, between the first and second ends of the housing. The compressible element 306 may be located between the one or more battery cells 308 and the first end of the housing, and the pressure sensor 304 may be located between the compressible element 306 and first end of the housing. The housing 310 may be generally configured to enclose each of the one or more battery cells 308, the pressure sensor 304, and the compressible element 306. The at least one controller 302 may be connected to the pressure sensor 304 and the compressible element 306. Lastly, in some embodiments, the compressible element 306 may be a piezoelectric.

The disclosure herein is not limited to the above mentioned configurations for the apparatuses. In certain embodiments, the positioning of the compressible element plays a key role in the pressurization or depressurization of the battery system. In other embodiments, the positioning of the compressible element plays a key role in mitigating significant volume changes during the charge and discharge cycles of the battery system. For instance, charging of the battery system causes large volume changes in anode active materials, for example, in lithium anodes. For example, in one embodiment, the one or more battery cells include a stack which upon charging, expands by more than 10%. Such large volume changes in lithium anodes generally benefit from the application of pressure to the lithium anode. In yet other embodiments, the positioning of the compressible element plays a key role in accommodating the volume and corresponding pressure changes of the battery system. In further embodiments, the positioning of the compressible element plays a key role in mitigating excessive pressure that can damage electrode layers or cause materials to flow that may result in a reduction in capacity, increase in resistance, or cause a safety concern(s) in the battery system. For instance, when sensitive soft materials are present in a battery system, for example, gel cathode ion conductors, pressure management prevents excessive pressure that can cause fade in such soft materials. As another example, when semi-solid materials are present in a battery that may creep over time, particularly when pressurized at elevated temperatures, pressure management may prolong the life of a battery. Materials in a battery that may exhibit creep at rates high enough to affect performance include soft metals such as lithium, sodium, magnesium, and calcium, or glassy materials such as sulfides or antiperovskites, or solid polymers or gels. Reasoned positioning of the compressible element includes, for example, between one or each end(s)

of the electrochemical stack; between one or more individual electrochemical cells of the electrochemical stack; or between one or each end(s) of the electrochemical stack and between one or more individual electrochemical cells of the electrochemical stack.

For example, in one embodiment, each of the one or more battery cells includes a rechargeable battery with a positive electrode, a lithium metal negative electrode, and a solid separator electrolyte. By way of further example, in one embodiment, the apparatus includes both a pressure sensor and a compressible element. By way of further example, in one embodiment, the battery module includes a pressure sensor. By way of further example, in one embodiment, the pressure sensor is between the housing and a face of the one or more battery cells. By way of further example, in one embodiment, the at least one member selected from the group consisting of a pressure sensor and a compressible element is part of the battery module housing and between the inner wall of the battery module housing and the outer wall of the one of the one or more electrochemical cells in a flexible pouch or can cell. By way of further example, in one embodiment, the pressure sensor is part of the battery module housing and between the inner wall of the battery module housing and the outer wall of the one of the one or more electrochemical cells in a flexible pouch or can cell. By way of further example, in one embodiment, the compressible element is part of the battery module housing and between the inner wall of the battery module housing and the outer wall of the one of the one or more electrochemical cells in a flexible pouch or can cell. By way of further example, in one embodiment, the housing includes at least two endplates and a tension element where the one or more battery cells are between the at least two endplates, and where the housing and the tension element may apply a compressive force to the at least two endplates. By way of further example, in one embodiment, the housing includes at least two endplates and a tension element where the one or more battery cells are between the at least two endplates, and where the housing and the tension element may apply a compressive force to the at least two endplates and normal to the face of the one or more battery cells. By way of further example, in one embodiment, the flexible pouch and can cell, each, independently, have an inner wall and an outer wall, wherein the battery module housing has an inner wall and an outer wall, and wherein the compressible fluid is between and in contact with the inner wall of the battery module housing and the outer wall of the flexible pouch or can cell. By way of further example, in one embodiment, the pressure sensor is between the inner housing walls and the outer wall of the electrochemical cell pouch or can cell. By way of further example, in one embodiment, the at least one electrochemical cell further comprises a compressible fluid inside the electrochemical cell in addition to the compressible fluid between and in contact with the housing and either the flexible pouch or can cell. By way of further example, in one embodiment, the compressible fluid inside the electrochemical cell housing is between and in contact with the at least one electrochemical cell and at least one conductive tab. By way of further example, in one embodiment, the housing includes at least two endplates and a tension element where the one or more battery cells are between the at least two endplates, and where the housing and the tension element may apply a compressive force of between 1 and 100 psi, or of between 10 and 1000 psi to the at least two endplates and normal to the face of the one or more battery cells. By way of further example, in one embodiment, the apparatus further includes at least two endplates, and the housing and the tension element apply a compressive force of between 1 to 100 psi or of between 10-1000 psi to the at least two endplates which is normal to the face of the one or more battery cells. By way of further example, in one embodiment, the apparatus further includes at least two endplates and the housing includes a tension element, wherein the one or more battery cells are between the at least two endplates; and wherein the housing and the tension element apply a compressive force to the at least two endplates which is normal to the face of the one or more battery cells. By way of further example, in one embodiment, each of the aforementioned end plates are dynamic endplates. By way of further example, in one embodiment, the housing includes at least two dynamic endplates and a tension element, wherein the at least one electrochemical cell is between the at least two dynamic endplates, and the at least two dynamic endplates and the tension element apply a compressive force to the at least one electrochemical cell. By way of further example, in one embodiment, the at least two dynamic endplates and the tension element apply a compressive force to the at least one electrochemical cell. By way of further example, in one embodiment, the housing includes a first end positioned opposite to and parallel with a second end, and a first side opposite to a second side where the first and second sides connect the first and second ends to form the housing. By way of further example, in one embodiment, the housing includes a first vertical end positioned opposite to and parallel with a second vertical end, and a first longitudinal side opposite to a second longitudinal side, wherein the first and second longitudinal sides connect the first and second vertical ends to form the housing. In certain embodiments, the first end and first side are connected by a 90° angle, and the second end and the second side are connected by a 90° angle. By way of further example, in one embodiment, the first vertical end and first longitudinal side are connected by a 90° angle and the second vertical end and the second longitudinal side are connected by a 90° angle. By way of further example, in one embodiment, the compressible element is positioned between the first end and the one or more battery cells. By way of further example, in one embodiment, the pressure sensor is positioned between the compressible element and the one or more battery cells. By way of further example, in one embodiment, the compressible element is positioned between the pressure sensor and the one or more battery cells. By way of further example, in one embodiment, the battery module further includes a fluid reservoir containing a compressible fluid and a pump where the fluid reservoir is connected to the pump. In certain embodiments, the pump includes a stepper motor. By way of further example, in one embodiment, the compressible element includes a fluid reservoir containing a fluid, and a pump where the fluid reservoir is connected to the pump. By way of further example, in one embodiment, the compressible element is a fluid. By way of further example, in one embodiment, the compressible element is disposed between the first end (i.e., of the housing) and the one or more battery cells. By way of further example, in one embodiment, the pressure sensor is located between the compressible element and the first end (i.e., of the housing). By way of further example, in one embodiment, the compressible element is located between the first end and the one or more battery cells, the pressure sensor is located between the compressible element and the first end, and the controller is connected to the pressure sensor and the pump, where the controller is configured to actuate the compressible element, and where the compressible element is configured to pressurize or depressurize the battery system. By way of further example, in one embodiment, the compressible element is configured to uniformly pressurize or uniformly depressurize the battery module. By way of further example, in one embodiment, the compressible element is configured to uniformly pressurize the battery module. By way of further example, in one embodiment, the compressible element is configured to uniformly depressurize the battery module. By way of further example, in one embodiment, the compressible element is an actuated compressible element. By way of further example, in one embodiment, the compressible fluid is an actuated compressible fluid. By way of further example, in one embodiment, the compressible element is a dynamic compressible element. By way of further example, in one embodiment, the compressible fluid is a dynamic compressible fluid. In certain embodiments, the compressible fluid is a gas, liquid, or combination thereof. In certain embodiments, the compressible fluid is a gas. In certain embodiments, the compressible fluid is a liquid. In certain embodiments, the compressible fluid is a sublimating liquid.

In certain embodiments, the controller is in electrical communication with the pressure sensor and the compressible element where the controller is configured to actuate the compressible element, and the compressible element is configured to pressurize or depressurize the battery module. In certain embodiments, the controller in electrical communication with the pressure sensor and the compressible fluid wherein the controller is configured to actuate the compressible fluid; and wherein the compressible fluid is configured to pressurize or depressurize the at least one electrochemical cell by actuating the compressible fluid. For example, in one embodiment, the controller is programmed to actuate the compressible element based on a pressure input to the pressure sensor from the one or more battery cells. By way of further example, in one embodiment, the controller is programmed to actuate the compressible fluid based on a pressure input to the pressure sensor from the at least one electrochemical cell. By way of further example, in one embodiment, the compressible element is configured to uniformly pressurize or uniformly depressurize the battery module. By way of further example, in one embodiment, the compressible element is configured to uniformly pressurize the battery module. By way of further example, in one embodiment, the compressible element is configured to uniformly depressurize the battery module. By way of further example, in one embodiment, the compressible fluid is configured to uniformly pressurize or uniformly depressurize the battery module. By way of further example, in one embodiment, the compressible fluid is configured to uniformly pressurize the at least one electrochemical cell. By way of further example, in one embodiment, the compressible fluid is configured to uniformly depressurize the at least one electrochemical cell. By way of further example, in one embodiment, the compressible element is configured to uniaxially pressurize the battery module. By way of further example, in one embodiment, the compressible fluid is configured to uniaxially pressurize at least one electrochemical cell. By way of further example, in one embodiment, the compressible element is configured to uniaxially depressurize the battery module. By way of further example, in one embodiment, the compressible fluid is configured to uniaxially depressurize the at least one electrochemical cell. By way of further example, in one embodiment, the compressible element is configured to isotropically pressurize the battery module. By way of further example, in one embodiment, the compressible fluid is configured to isotropically pressurize the at least one electrochemical cell. By way of further example, in one embodiment, the compressible element is configured to isotropically depressurize the battery module. By way of further example, in one embodiment, the compressible fluid is configured to isotropically depressurize the at least one electrochemical cell. By way of further example, in one embodiment, the controller is configured to actuate the compressible element based on a pressure input to the pressure sensor from the pump. By way of further example, in one embodiment, the compressible element is configured to apply hydrostatic pressure to the battery cell.

In certain embodiments, the compressible element includes a stepper motor. In certain embodiments, the compressible element includes a piezoelectric. In certain embodiments, the compressible element is a piezoelectric. For example, in one embodiment, the compressible element is located between the first end and the one or more battery cells, the pressure sensor is located between the compressible element and the first end, and the controller is connected to the pressure sensor and the piezoelectric, where the controller is configured to actuate the piezoelectric, and where the compressible element is configured to pressurize or depressurize the battery system. By way of further example, in one embodiment, the controller is configured to actuate the compressible element based on a pressure input to the pressure sensor from the piezoelectric. By way of further example, in one embodiment, the compressible element is configured to uniformly pressurize or uniformly depressurize the battery module. By way of further example, in one embodiment, the compressible element is configured to uniformly pressurize the battery module. By way of further example, in one embodiment, the compressible element is configured to uniformly depressurize the battery module. By way of further example, in one embodiment, the compressible element is an actuated compressible element. By way of further example, in one embodiment, the compressible element is a dynamic compressible element.

Actuation of the compressible element to pressurize or depressurize the battery system is dependent upon which compressible element is employed. In certain embodiments, the compressible element is an actuated compressible element. In certain embodiments, the compressible element is a dynamic compressible element. For example, in one embodiment, when the compressible element is a spring, actuation is accomplished, for example, by increasing or decreasing tension of a steel strap that wraps the battery stack(s) using a screw-driven actuator (See, e.g., FIG. 1). By way of further example, in one embodiment, when the compressible element is a combination of a fluid reservoir and a pump, actuation is accomplished, for example, by increasing or decreasing pneumatic or hydraulic pressure using a pneumatic or hydraulic linear actuator (See, e.g., FIG. 2). By way of further example, in one embodiment, when the compressible element is a piezoelectric, actuation is accomplished, for example, using an electrical linear actuator (See, e.g., FIG. 3).

In certain embodiments, the housing is one selected from the group consisting of a strap, a metal band, a rigid can, a flexible pouch, and a metal wire. For example, in one embodiment, the housing is a strap. By way of further example, in one embodiment, the housing is a metal band. By way of further example, in one embodiment, the housing is a rigid can. By way of further example, in one embodiment, the housing is a flexible pouch. By way of further example, in one embodiment, the housing is a metal wire. In certain embodiments, the housing is a static enclosure. For example, in one embodiment, the housing is a battery can. By way of further example, in one embodiment, the housing is a battery pouch. In certain embodiments, the at least one electrochemical cell is in the flexible pouch.

In certain embodiments, the tension element is one selected from the group consisting of a spring, a rubber band, an elastic member, a steel strap, a string, a cord, a chain, a coil, a spoiled wire, a wench, and combinations thereof. For example, in one embodiment, the tension element is a spring. By way of further example, in one embodiment, the tension element is a rubber band. By way of further example, in one embodiment, the tension element is an elastic member. In certain embodiments, the elastic member is a steel strap. In certain embodiments, the elastic member is a string. In certain embodiments, the elastic member is a cord. In certain embodiments, the elastic member is a chain. In certain embodiments, the elastic member is a coil. In certain embodiments, the elastic member is a spoiled wire. In certain embodiments, the elastic member is a wench. By way of further example, in one embodiment, the tension element is a material having a Young's modulus of 1 MPa or greater. By way of further example, in one embodiment, the tension element is a material having a Young's modulus of 10 GPa or greater. By way of further example, in one embodiment, the tension element is a material having a Young's modulus of 100 GPa or greater.

In certain embodiments, the fluid is a gas, liquid, or combination thereof. For example, in one embodiment, the fluid is a gas. By way of further example, in one embodiment, the fluid is a liquid. By way of further example, in one embodiment, the fluid is a combination of a fluid and a gas. In certain embodiments, the ratio of fluid:gas is 1:1, 2:1, 3:1, 4:1, and 5:1 by volume. In certain embodiments, the ratio of gas:fluid is 1:1, 2:1, 3:1, 4:1, and 5:1 by volume. By way of further example, in one embodiment, the fluid is an evaporating liquid.

The management of battery pressure is related to a ratio for expansion:compression of the battery cell or stack. The highest ratio possible for expansion:compression is desired, while meeting pressure (or pressure uniformity) and extended lifetime requirements for the battery to minimize battery system volume. In certain embodiments, expansion of the battery is related to methods described herein for managing volume increases from a discharged state of the battery, for example, when a discharged battery is subsequently charged, the volume of the battery will increase. For example, in one embodiment, at least one electrochemical cell expands by more than 10% by volume when charged from a state-of-charge (SOC) of 10% or less. Accommodating the increase in the volume of the battery upon charge is important to battery design, and the management of the inherent pressure(s) involved upon such battery volume increases is desirable, for example, in extending the lifetime of the battery. Similarly, compression of the battery is related to methods described herein to manage battery pressure. In certain embodiments, the expansion of the battery upon charge to the limits of the battery system housing, for example, generate compressive forces that may be used to adjust or manage battery pressure. Accordingly, in certain embodiments, a ratio for the size of the expanded state to the compressed state is between 2:1 and 5:1. For example, the ratio expansion:compression is 2:1, 3:1, and 4:1. For example, in one embodiment, the ratio for expansion:compression is 2:1. By way of further example, in one embodiment, the ratio for expansion:compression is 3:1. By way of further example, in one embodiment, the ratio for expansion:compression is 4:1.

In certain embodiments, each of the one or more battery cells includes a positive electrode, a lithium metal negative electrode, and a solid separator electrolyte. For example, in one embodiment, each of the one or more battery cells includes a lithium metal negative electrode. By way of further example, in one embodiment, each of the one or more battery cells includes a solid separator electrolyte. By way of further example, in one embodiment, each of the one or more battery cells includes a lithium metal negative electrode and a solid separator electrolyte. In certain embodiments, the electrochemical cells share a solid-state separator electrolyte. In certain embodiments, the electrochemical cells share a solid separator electrolyte. In certain embodiments, the battery cells are prismatic. In certain embodiments, at least one electrochemical cell is in a flexible prismatic pouch.

In certain embodiments, an electric or hybrid vehicle, an airplane, a robot, or an autonomous drone includes any one or more of the apparatuses described herein. For example, in one embodiment, an electric or hybrid vehicle includes the apparatus and other embodiments of the apparatus described herein. By way of further example, in one embodiment, an airplane includes the apparatus and other embodiments of the apparatus described herein. By way of further example, in one embodiment, an autonomous drone includes the apparatus and other embodiments of the apparatus described herein. By way of further example, in one embodiment, an electric or hybrid vehicle includes any one or more of the battery modules or containers as described herein. By way of further example, in one embodiment, an electric vehicle includes any one or more battery module described herein. By way of further example, in one embodiment, an electric vehicle includes any one or more container described herein. By way of further example, in one embodiment, a hybrid vehicle includes any one or more battery modules described herein. By way of further example, in one embodiment, a hybrid vehicle includes any one or more container described herein. By way of further example, in one embodiment, an airplane includes the battery module or container described herein. By way of further example, in one embodiment, the airplane includes any one or more battery modules described herein. By way of further example, in one embodiment, the airplane includes any one or more containers described herein. By way of further example, in one embodiment, an autonomous drone includes the battery module or container described herein. By way of further example, in one embodiment, the autonomous drone includes any one or more battery module described herein. By way of further example, in one embodiment, the autonomous drone includes any one or more container described herein. By way of further example, in one embodiment, a robot includes the battery module or container described herein. By way of further example, in one embodiment, the robot includes one or more battery modules described herein. By way of further example, in one embodiment, the robot includes one or more containers described herein.

Also provided herein are methods for pressurizing or depressurizing a battery system. Pressurizing or depressurizing the battery system is important for the management of volume expansion of active materials in the battery. In certain instances, the battery includes a Li metal anode that expands and contracts depending on the state of charge. When the battery is charging, the anode tends to expand upon intercalation of lithium ions. When the battery is discharged, the anode tends to contract upon the release of lithium ions into the electrolyte. Management of this process occurs by providing pressure or releasing pressure, as needed, depending on battery metrics. For example, in one embodiment, the battery metrics include voltage, OCV, voltage hysteresis, impedance, or area-specific resistance (ASR), state-of-charge (SOC), battery history, and temperature. In certain embodiments, ASR is a DC or series resistance. In another embodiment, management of this process occurs by providing pressure or releasing pressure, as needed, depending on a plurality of input parameters. The plurality of input parameters may be selected from any available source of inputs. In some embodiments, the plurality of input parameters are selected from the group consisting of vehicle use information, location information, drive types, temperature information, pressure information, heating device/battery/vehicle information, weather information, driver inputs, user information, external information, traffic information, calendar information, charging equipment availability information, and combinations thereof. These and other input parameters are described in U.S. Patent Application Publication No. U.S. 2016/0059733, which was filed Aug. 27, 2015 and entitled "BATTERY THERMAL MANAGEMENT SYSTEM AND METHODS OF USE," and published Mar. 3, 2016, the contents of which are incorporated herein by reference in their entirety.

Pressure information may be selected from the group consisting of battery energy capacity, state of charge of battery, battery self-discharge rate, a relationship between two or more of power of battery, temperature of battery, pressure of battery, age of battery, a thermal time constant for the battery, capacity of the compressible element, efficiency of the compressible element, powertrain of vehicle, thermal system configuration of vehicle, motor power of vehicle, powertrain efficiency of vehicle, vehicle minimum power output level for safe driving, and combinations thereof. For example, in one embodiment, pressure information is battery energy capacity. By way of further example, in one embodiment, pressure information is state of charge of battery. By way of further example, in one embodiment, pressure information is battery self-discharge rate. By way of further example, in one embodiment, pressure information is a relationship between two or more of power of battery. By way of further example, in one embodiment, pressure information is temperature of battery. By way of further example, in one embodiment, pressure information is pressure of battery. By way of further example, in one embodiment, pressure information is age of battery. By way of further example, in one embodiment, pressure information is a thermal time constant for the battery. By way of further example, in one embodiment, pressure information is capacity of the compressible element. By way of further example, in one embodiment, pressure information is efficiency of the compressible element. By way of further example, in one embodiment, pressure information is powertrain of vehicle. By way of further example, in one embodiment, pressure information is thermal system configuration of vehicle. By way of further example, in one embodiment, pressure information is motor power of vehicle. By way of further example, in one embodiment, pressure information is powertrain efficiency of vehicle. By way of further example, in one embodiment, pressure information is vehicle minimum power output level for safe driving.

In a number of embodiments, the plurality of input parameters may be selected from the group consisting of inputs that are personal to a user/vehicle, inputs that are generally applicable, inputs that are historical, inputs that are current, inputs that are sensed, inputs that are referenced, and combinations thereof. In various embodiments, a particular subset of input parameters may be used, as described and claimed herein. For example, in one embodiment, the plurality of input parameters are inputs that are personal to a user/vehicle. By way of further example, in one embodiment, the plurality of input parameters are inputs that are generally applicable. By way of further example, in one embodiment, the plurality of input parameters are inputs that are historical. By way of further example, in one embodiment, the plurality of input parameters are inputs that are current. By way of further example, in one embodiment, the plurality of input parameters are inputs that are sensed. By way of further example, in one embodiment, the plurality of input parameters are inputs that are referenced.

Certain methods for pressuring or depressurizing electric vehicle batteries may be based on the proximity of a user to the battery. However, these methods only provide seconds of pressure modification time, which is insufficient to significantly modify the pressure of the battery for particular performance conditions by the time the battery is actually used. Some methods may predict drive start times using statistical analysis of repetitive drives. However, these methods are also insufficient in that they don't provide sufficiently long lead times or have relatively low probability of success. This low success level is due to the fact that many drives are not repetitive, and that even repetitive drives may vary. Thus, these methods frequently result in false predictions, wasted energy, and insufficient lead times. Also, a battery pressurized or depressurized above or below, respectively, battery specifications will have detrimental effects due to structural integrity losses (e.g., battery components breaking and failing), and such losses are wasteful especially before the battery is actually used. Furthermore, energy used to modify pressure beyond the battery's optimal pressure specifications is wasteful. Wasted energy from the aforementioned early or excessive pressure modifications ultimately results in wasted cost (e.g., when the battery is plugged into a charging station) and limited driving range (e.g., when the battery is not plugged in and the battery is not used).

As such, a problem exists in the secondary battery field related to predictively modifying pressure in a battery so that a desired battery pressure and associated battery performance is achieved when the battery is actually used, and so that power is not wasted unnecessarily. Another problem exists related to dynamically pressurizing or depressurizing a secondary battery so that the battery operates at relevant (and changing) levels of performance during a drive, for example, at an initial start and also five minutes into a particular drive. Another problem exists related to methods and systems for accurately predicting whether, when, and how much to modify pressure in a battery, where the pressurizing or depressurization begins several minutes or more in advance of the battery's use.

Pre-pressurizations or pre-depressurization can be beneficial for various battery types including conventional insertion-type lithium-ion batteries as well as newer high energy density battery materials. Area specific resistance (e.g., resistance at the interface between cathode active material and electrolyte) and bulk conductivity are both a function of temperature and pressure. Pre-pressurization is particularly important for certain solid-state lithium ion rechargeable batteries because of conductivity limitations of solid-state electrolyte and/or lower surface area interfaces (e.g., a planar interface between a cathode and solid-state electrolyte) that may result in cell power limitations, especially at lower pressures.

Various embodiments herein relate to methods for predicting whether, when, and how much to pressurize or depressurize a battery. The methods may be used to predictively pressurize or depressurize a battery with at least a minute of lead time. In some cases a lead time is at least about 1 minute, at least about 2 minutes, at least about 5 minutes, at least about 10 minutes, at least about 15 minutes, at least about 30 minutes, or at least about 1 hour. An optimal lead time will depend on the instant conditions when pressure modification occurs. The methods may use various input parameters for determining whether or not to modify pressure at a given time. Generally speaking, the methods involve determining a likely vehicle start time and an associated level of confidence that a drive will start at that time, determining a probability threshold at which pressure modifications should occur, and performing pressure modifications if the determined confidence level is greater than the determined probability threshold. The methods may also involve predicting the level of power that is required for a predicted drive and modifying pressure of the battery to a pressure that enables the battery to operate at the level of power predicted to be required, such that the battery is appropriately pressurized to an optimal pressure at the predicted start time.

A number of options are available for modifying the pressure in the battery, and the embodiments herein are not limited to any particular pressure modification method. In some examples, the battery depressurizes itself internally by discharging stored energy to another sink of electrical energy, and generating heat internally through the battery's internal resistance. In some examples, the battery pressurizes itself internally when the battery is being charged. This method is particularly effective at low battery pressures, when the battery requires the most pressurizing.

In other examples, the battery may provide electrical power to an external heating element, such as an electrical resistance heater, and the battery is pressurized by direct thermal contact with the heating element, or indirectly by thermal contact with another fluid or object heated by the heating element. A fluidic heat exchange system may be used in some cases.

In some examples, the battery is heated, directly or indirectly, by heat emitted from a combustion engine of a plug-in hybrid vehicle. Such heating may be particularly useful for raising the pressure of a battery while driving. This may be beneficial where an initial portion of the drive requires low power (e.g., using surface streets to drive toward the highway) and a later portion of the drive requires higher power (e.g., driving on the highway). Other methods of heating or cooling a battery are set forth in the following patent applications, each of which is herein incorporated by reference in its entirety: International PCT Patent Application No. PCT/US2015/010179, filed Jan. 5, 2015, and titled "THERMAL MANAGEMENT SYSTEMS FOR VEHICLES WITH ELECTRIC POWERTRAINS"; International PCT Patent Application No. PCT/US14/61761, filed Oct. 22, 2014, and titled "THERMAL AND ELECTRICAL CONNECTIONS FOR BATTERY SYSTEMS"; and U.S. Nonprovisional patent application Ser. No. 13/763,636, filed Feb. 9, 2013, and titled "BATTERY SYSTEM WITH SELECTIVE THERMAL MANAGEMENT."

In certain examples, the battery provides electrical power to a device, such as a compressor, which drives a thermodynamic cycle and generates heat that is used to pressurize the battery, directly or indirectly by thermal contact with another fluid or object.

The disclosed methods are applicable to any battery that requires pressure modifications for improved performance. Many solid-state batteries should be at least about 10° C., or at least about 15° C., or at least about 20° C. to perform well (e.g., at full power), and thus benefit from pre-heating when the batteries are cooler than these temperatures. These methods are applicable to battery cells, batteries, battery packs, and collections of batteries and battery packs. In some solid-state batteries, such as those having conversion active material cathodes, the batteries should be at least about 10° C., or at least about 15° C., or at least about 20° C., or at least about 30° C., or at least about 40° C., or at least about 50° C., or at least about 60° C., or at least about 70° C., or at least about 80° C., or at least about 90° C., to perform well The disclosed methods may be used with any type of batteries. The methods are most useful when used in the context of high energy density batteries. In some cases the batteries have an electrode material characterized by an operating temperature between about −40° C. to about 120° C., or an operating temperature of about 80° C.; or an operating temperature of about 60° C.; or an operating temperature of about 30-60° C.

Setting a Driving Probability Threshold

As noted above, various methods disclosed herein involve predicting/determining the time at which a vehicle is expected to start being driven, determining the confidence level that the vehicle will be driven at the expected start time, determining a probability threshold, and modifying the pressure of the battery to a desired level if the confidence level that the vehicle will be driven at the expected start time is greater than the probability threshold. Both the confidence level that the vehicle will be driven at a particular time and the probability threshold (as well as the optimal pressure and lead time) can vary over time based on various input parameters. Higher probability thresholds mean that modifying the pressure is less likely to occur for any given set of inputs.

One input parameter that can be a factor in determining the probability threshold is whether or not the vehicle is plugged in to an external power source. When a vehicle is plugged in, there is concern about wasting energy by pressurizing the battery when such pressurizing is not ultimately needed. Conversely, when a vehicle is not plugged in, energy waste is a more severe problem. When not plugged in (and especially when not in use) any excessive pressure drains the energy available in the vehicle (e.g., draining the battery or other energy storage system). If the battery is unnecessarily pressurized a number of times before it is driven, the vehicle will have less energy available when the vehicle is finally driven, thus limiting the distance that can be driven using the remaining electric power. As such, the determination of the probability threshold may take into account whether or not the vehicle is plugged in. If the vehicle is plugged in, the probability threshold may be determined to be relatively lower. The lower probability threshold means that it is more likely that pressurization will occur for any given set of inputs. Similarly, if the vehicle is not plugged in, the probability threshold may be determined to be relatively higher, making it less likely that pressurization will occur for a given set of inputs.

Another input parameter affecting the determined probability threshold is the state of charge (SOC) of the battery. When a battery has a low SOC, there is relatively little energy available for self-pressurizing the battery, assuming that depressurization occurs through battery discharge, and it is more important to conserve remaining energy for driving. As such, if a battery has a low SOC, the probability threshold may be determined to be relatively higher. Conversely, when a battery has a high SOC, there is more energy available, and it is less important to conserve the remaining energy for driving. Thus, if a battery has a high SOC, the probability threshold may be determined to be relatively lower. Because the battery may be losing power as the battery is (repeatedly) pressurized and depressurized, the SOC can change over time. Thus, the probability threshold may also change over time as the SOC changes. In one example, a battery starts fully charged and the probability threshold begins relatively low. As the battery repeatedly pressurizes or depressurizes without being driven (in part due to the low probability threshold), the battery loses energy and the SOC is reduced. In response to the decreased SOC, the probability threshold may be raised and modifying the pressure may be less likely to occur as the battery continues to pressurize and depressurize. Eventually the battery may reach a sufficiently low SOC that the probability threshold is raised above the confidence level. At this point, modifying the pressure ceases to occur and the remaining battery charge is conserved.

The amount of time before an upcoming predicted drive may also affect the probability threshold. If it is determined that the next likely drive will not occur for a day or more, for example, the probability threshold may be determined to be relatively higher in order to avoid wasting energy pressurizing or depressurizing the battery again and again. Conversely, if it is determined that the next likely drive will occur within a shorter period, for example, hours, the probability threshold may be determined to be relatively lower. Where a predicted upcoming drive is imminent, there will be less energy wasted because the battery isn't repeatedly pressurized or depressurized over a long period of time. A separate threshold may be set for determining when the next "likely" drive will be in determining the length of time until the next upcoming likely drive. The likelihood of driving (e.g., the confidence level that a drive will occur at an expected start time) may be determined as set forth below.

Another factor that can affect a determined probability threshold is the length of an expected drive, which may be determined using the methods and inputs described further below. Where a longer drive is expected to occur, more power should be conserved for the drive, and less power should be consumed predictively modifying pressure of the battery. As such, if it is determined that an upcoming drive is long (e.g., requiring a substantial amount of the energy in the battery), the probability threshold may be determined to be relatively higher. Conversely, if it is determined that an upcoming drive is short (e.g., requiring only a small portion of the energy in the battery), the probability threshold may be determined to be relatively lower.

Similarly, the type of drive expected and the resulting amount of modifying pressure needed to bring the batteries to a pressure allowing such a drive can affect the probability threshold. Where an expected drive involves only city driving or other relatively low power driving, relatively less pressure will be used to bring the battery up to a pressure that permits the battery to deliver such power. Because less pressure/energy is needed to pressurize or depressurize the battery to the required pressure, it is less problematic to pressurize or depressurize unnecessarily. As such, if it is determined that an upcoming drive will require relatively low power, the probability threshold may be determined to be relatively lower. Conversely, if it is determined that an upcoming drive will require relatively higher power (e.g., if it is expected that the vehicle will be driven on the highway soon after starting), the probability threshold may be determined to be relatively higher.

Similarly, the location at which the vehicle is parked can affect the probability threshold, which may be determined using the methods and inputs described further below. When the vehicle is parked at a location where the duration between drives is typically longer (e.g., an airport, train station, bus station), the longer span of time means energy of the battery lost to self-discharge will be cumulatively higher. In addition, the multiple false predictions within the long duration between drives risks leaving the battery with less energy than is desired for the next drive. Consequently, the probability threshold may be determined to be relatively higher.

User preferences can also affect the probability threshold. Some drivers are more energy conscious and would prefer to avoid wasting energy or being left with insufficient energy to make a drive. Other drivers are more performance conscious and would prefer to have a vehicle that is ready to go the moment they want to drive. In certain cases a driver may input their preferences into a system that controls whether or not modifying pressure occurs. Such preferences may be input using a user interface in/on the vehicle, on a smart phone, tablet, computer, etc. In some cases such preferences can be stored in a user ID/profile that is associated with a particular user (and which may be transferred between different vehicles). Information associated with the user ID/profile may be stored in a variety of locations as discussed elsewhere herein. As used herein, storage of information includes physical and electronic (e.g., RAM, SIM card, computer memory) storage of information using currently available information storage technology. The preferences may be specified using a sliding scale between energy conservation/storage and immediate power/performance, or other related preferences. In another example, a user may individually rate the perceived importance of energy savings/storage and performance (or related preferences) without presenting them as a sliding scale/tradeoff. In some embodiments a user may set such preferences for different conditions. For instance, a user may set different preferences for when a vehicle is plugged in vs. when the vehicle is not plugged in, or when the battery has at least a minimum amount of energy vs. when the battery has less energy, etc. Such preferences can then be used when determining the probability threshold. If, for example, a user indicates that they strongly prefer energy savings/storage over immediate performance, a probability threshold may be determined to be relatively higher. The higher probability threshold will make it less likely that energy is wasted on modifying pressure of the battery when it isn't used. On the other hand, if a user indicates that they prefer immediate performance, a probability threshold may be determined to be relatively lower. The lower probability threshold will make it more likely that a battery is pressurized or depressurized to a desired pressure at any given time.

The price of electricity may also factor into the determination of the probability threshold. When electricity prices are higher, wasted energy is more of a concern and the probability threshold may be determined to be relatively higher. Conversely, when electricity prices are lower, unnecessary pressure modifications are less costly and therefore less of a concern, making a relatively lower probability threshold more beneficial.

The probability threshold can be statically or dynamically set to any desired level. A relatively low probability threshold may fall between about 0-30%, a moderate probability threshold may fall between about 30-70%, and a relatively high probability threshold may fall between about 70-100%. These values are provided merely as guidelines and are not in any way limiting.

In some cases the various inputs may be assigned weighing factors that determine how relatively important the various input parameters are. Examples are presented below in the context of determining the confidence that a drive will occur, with reference to Tables 2 and 3. This same method may be used for determining a probability threshold. While weighing factors for inputs can change with implementation and may even be updated dynamically based on current data, many inputs tend to affect the probability threshold in predictable ways. Table 1 below lists one example of the expected relative weight that such inputs may individually have on a probability threshold for a variety of available inputs.

TABLE 1

| Input | Current charging status; Vehicle plugged-in | Predicted drive type: known destination with charger | Predicted drive type: long distance drive | Current SOC: relatively low | Current battery temperature: relatively low | Location: place of travel (e.g., airport, train station, etc.) | Current electricity price: high |
|---|---|---|---|---|---|---|---|
| Relative effect on probability threshold | 1 | 2 | 3 | 3 | 2 | 4 | 3 |

4-Highest;
3-High;
2-Low;
1-Lowest

Determining the Expected Drive Start Time and Confidence Level

The instant disclosure provides methods for determining whether, when, and how extensively to pressurize or depressurize the battery so that the battery is appropriately pressurized or depressurized if the probability of an upcoming drive (e.g., the confidence level for a particular expected start time) is determined to be above the probability threshold. The disclosed methods utilize new inputs and combinations of inputs to determine the probability that a drive will occur. As such, the disclosed methods may be used to predictively pressurize or depressurize a vehicle battery with at least one minute or more of lead time and a high degree of accuracy. By using the disclosed inputs and combinations of inputs, the methods can predict whether and when a drive will occur with a high degree of correctness. This helps minimize wasted energy used to pressurize or depressurize the vehicle battery unnecessarily.

Figure 5:
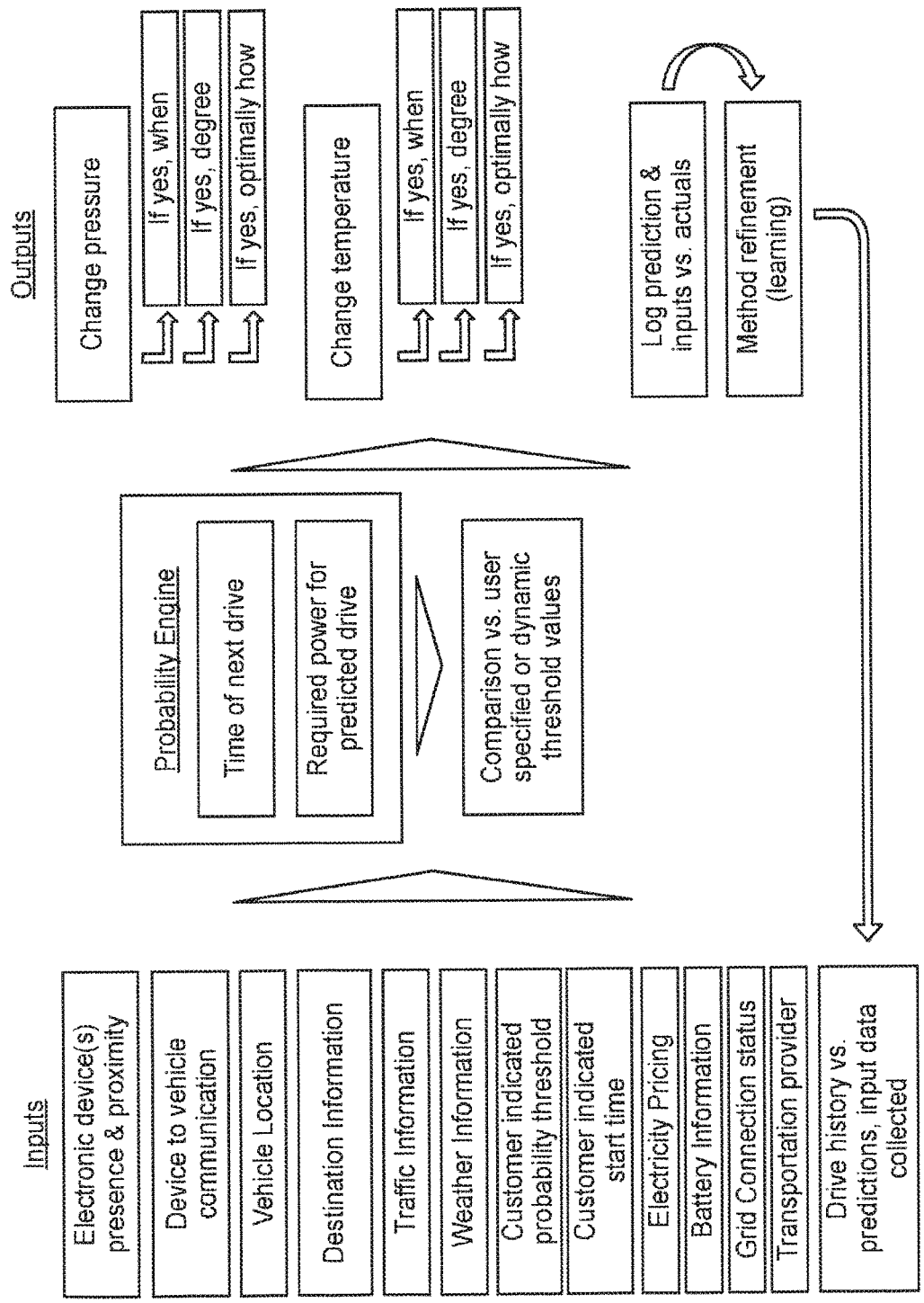
FIG. 5 shows one embodiment of a block diagram for a power management method using a feedback loop.

FIG. 5 presents various categories into which the individual input parameters may fit. Different categorizations may also be used. First, the inputs may be categorized between those that are personal to a user/vehicle and those that are generally applicable to many people. Inputs that are generally applicable may be categorized between historical general inputs and current general inputs. Inputs that are personal to a user/vehicle may be categorized between historical personal inputs and current personal inputs. Inputs that are current personal inputs may be categorized between current sensed personal inputs and current referenced personal inputs.

Examples of historical general inputs include, but are not limited to, historical traffic information (e.g., traffic over expected routes, for particular days of the week and times, for particular holidays, for particular weather conditions, etc.), historical weather data (e.g., annually-based and daily/hourly-based weather information, including temperature, precipitation, and visibility), etc. Examples of current general inputs include, but are not limited to, current traffic data (e.g., live traffic over expected routes, construction data, detour data, etc.), current weather data (e.g., temperature, etc. in a region where the vehicle is located), general calendar data (e.g., day of the week, whether or not it is a holiday, etc.), and electricity prices.

Generally speaking, inputs that are generally applicable would be relevant to anyone in the same general region as a driver. In some cases a user's particular route may factor in (e.g., traffic data over various routes); however, the traffic data is still generally applicable to many people. On the other hand, inputs that are personal to a user/vehicle may only be relevant for that user or vehicle. For some predictive pressurizing or depressurizing conditions, such as those which rely on analyzing large data sets of multiple users, and as described below, some individual user data may be relevant to other users that are embraced by the same data set or demographic.

Examples of historical personal inputs include, but are not limited to, past driving data for a user or vehicle (e.g., all driving history including drive start times, drive durations, drive routes, destinations, starting locations, driving tendencies (e.g., speed, aggressive vs. non-aggressive, typical acceleration, etc.), drive types (e.g., city vs. highway), etc.), battery characteristics (e.g., energy capacity, self-discharge rate, power vs. temperature, state of charge vs. age relationships, thermal time constant), battery warming characteristics (e.g., heat capacity of battery materials and related properties, past warming conditions and results, etc.), properties of an available heater or compressible element (e.g., capacity and efficiency), vehicle characteristics (e.g., vehicle powertrain characteristics (e.g., type of powertrain (e.g., electric, plug-in hybrid, hybrid), thermal system configuration, pressure system configuration, motor power, powertrain efficiency, vehicle specific minimum power output levels for safe driving)), and destination information (e.g., specific GPS coordinates refer to an airport, presence of charging infrastructure), etc.

While historical personal inputs are generally based on information that relates to past conditions, current inputs generally relate to current or future conditions, and in some cases may be accessed on-the-fly. As noted above, current personal inputs may be categorized between current sensed personal inputs and current referenced personal inputs. Sensed inputs may be generated by one or more sensors including, but not limited to, GPS or other positioning sensors, thermometers, etc. In some cases the sensed data is referenced from another source that senses the relevant data itself. One example is temperature data generated by a thermometer, such data being published by an online weather company and referenced by a battery system of a vehicle as an input in determining whether to pressurize or depressurize.

Examples of current sensed personal inputs include, but are not limited to, the current temperature of a battery (e.g., from a thermometer or other sensor), the current pressure of the battery, the battery state of charge, the current temperature of a vehicle (e.g., from a thermometer or other sensor, or from a current weather report/site/database), the current pressure of a vehicle (e.g., from a barometer or other sensor, or from a current weather report/site/website), the current location of a vehicle (e.g., from a GPS or other sensor), the current location of a user or users (e.g., from a GPS or other sensor, for example on a cellular phone, tablet, key fob, camera (e.g., at work, home, etc.), or other electronic device or combination of devices), the proximity of a user to a vehicle (e.g., from a combination of GPS, vehicle camera, infrared, or other sensors), the location of a user with respect to particular locations (e.g., whether or not the user is at home, work, grocery store, gym, airport, etc., which may be sensed through a GPS or other sensor integrated into any device carried by a user), whether the vehicle is currently connected to an external power source (e.g., a charger), etc.

Examples of current referenced personal inputs include, but are not limited to, user instructions and preferences (e.g., a user profile detailing a user's various driving preferences, which may be changed by a user as they please), a user's calendar/schedule and their upcoming commitments (e.g., such data may be pulled from a user's electronic calendar, email messages, text messages, Google Now data, etc.), transportation provider status (e.g., flight, train, bus, ship arrival time), etc.

In some embodiments, information related to "smart home" devices may be used as an input. Such information may be collected from various types of internet-connected devices. In one example, a smart alarm clock may provide information about when the user wakes up, which may factor into a prediction about when an upcoming drive will occur. Similarly, information from kitchen appliances such as coffee makers or entertainment system components such as radios and televisions may indicate that a driver is awake and preparing to drive. In another example, a smart refrigerator may sense that the refrigerator is empty. The prediction methods may be used to determine that each time the fridge is empty at 10 a.m. Saturday, there is a high probability that a user will go to the grocery store. Any available data may be used. Such data may be considered sensed or referenced, depending on what the data relates to and how it is collected.

Any combination of available data may be used. The use of additional inputs may increase the accuracy of the predictions.

As noted, one type of input that may be used to predict a start time and evaluate the confidence level that a vehicle will be driven at the expected start time is data originating from a user's electronic devices and/or profiles/stored information. This data often provides a very accurate indicator of when modifying pressure is likely to be needed. For instance, if a user has a soccer match scheduled in their Google Calendar for 10 a.m. on Saturday at Park Arena and it takes 20 minutes to drive from where the vehicle is located to the Park Arena, the system can determine that modifying pressure is likely to be required such that the vehicle is ready to drive at 9:40 a.m. that Saturday. In another example, the system takes numerous users into account including, for example, both a driver and any number of passengers. The driver and passengers' calendar data (and location data, etc.) may be used together to determine the probability of driving at a given time. In a particular case, the system takes into account driver and passenger locations based on GPS or other signals from the driver and passengers' cellular phones or other electronic devices.

Similarly, the proximity of a user (or multiple users) to a vehicle can be used as an input. The proximity may be sensed based on any one or more of the location of a key, fob, GPS signals, Wi-Fi signals, Bluetooth signals, etc. In certain cases this information may be combined with other inputs, for example where a vehicle (or battery system, in general, including any on-car and off-car information storage components) contains information about the likely next trip start, duty cycle, and confidence threshold for warming. In some examples, a cell phone automatically sends a vehicle/battery system a signal such as, but not limited to, a text message, when the cell phone approaches the location of the vehicle. The signal may be sent by Wi-Fi or cellular signals, or the like. GPS and related location services may be used to determine when a cell phone approaches the location of the vehicle.

In another example, the vehicle communicates with cell phone towers and is notified when a relevant cell phone is within range of the nearest tower or towers. In another example, a cell phone sends the vehicle a signal or information that helps determine the time or type of the next predicted drive. Such information may originate from various sources such as calendar appointments, 'Google Now' info, emails with flight information or other information related to commitments, meetings, appointments, trips, plans, etc. The battery pressurizes or depressurizes according to this information. In another example, a cell phone sends an infrared IR signal when the cell phone is nearby that is picked up by vehicle IR cameras/sensors.

Destination information can also be a relevant input. A destination can be used to determine likely driving routes, which can determine the power level needed for driving (and thus the pressure or temperature to which the battery should be modified). For instance, if a user receives a text indicating that they will meet a friend for coffee 30 blocks across town in an hour, a system may predict that it is likely surface streets will be used, and modifying the pressure may be done to an extent that is sufficient for city driving, but not highway driving. In this example, modifying pressure to a level sufficient for highway driving is unnecessary and likely to waste energy. Modifying pressure will begin at a time that allows the battery to pressurize or depressurize to the desired pressure by the time the drive is likely to start. In a similar example, a user may receive a text or email indicating they have an interview scheduled an hour away from the user's home on Monday morning. The system may use this information to determine that highway driving will likely be used based on the distance to the destination and the available routes. In this example it is beneficial to pressurize or depressurize the battery to a relatively higher pressure compared to the above example. Here, since highway driving is expected and greater power is expected to be needed, modifying pressure will occur to a greater degree. As noted elsewhere herein, the system may determine that modifying pressure all the way to a pressure that enables highway-level power is not needed if the expected route will include surface driving prior to the highway driving, where the battery can continue to pressurize or depressurize as the vehicle makes its way to the highway.

Another type of input involves traffic information. Where traffic is heavier (in general or along expected routes), driving is likely to be slower and less power is needed. Since less power is needed, the battery can be pressurized or depressurized to a relatively lower pressure. Traffic information may be based on real time conditions and/or average or patterned historical traffic data (e.g., patterned data may be based on the time of day and/or day of the week and/or holiday status).

Weather information may also be used, and can relate to current conditions or historical conditions. Relevant weather information can include the actual temperature (e.g., from a sensor, weather service, etc.), actual pressure (e.g., from a sensor, weather service, etc.) as well as any weather factors that can affect road conditions (e.g., whether there is precipitation, the degree of precipitation and its effect on road safety, presence of storms, etc.). Historical weather information (e.g., based on annual and/or daily/hourly weather patterns) may also be used. Temperature and pressure are particularly relevant in that the temperature and pressure directly factors into how much heating or modifying pressure is needed due to heat loss or heat gain, or pressure loss or pressure gain, driven by the difference in temperature and pressure between the battery system and the ambient environment.

In some cases one or more inputs may come directly from a user. For instance, a user can indicate a particular drive start time, driving schedule, driving preferences, etc., which may be used by the system to schedule modifying pressure as needed. Such user inputs may occur through any available mechanism, including but not limited to, a user interface implemented on an electronic device such as a computer, laptop, phone, or other electronic device. The user interface may also be on the vehicle itself. In certain cases many user interfaces are available on different devices, and a user can choose to interact with the system using their preferred device. In some cases, a user ID/profile may be used to store information relevant to a particular user, as discussed elsewhere herein. Such user ID/profile may be accessed using the user interface on any of the listed devices. Information provided through a user interface may be sent to and used by a vehicle through any available means. In one example, a user wants the vehicle be at full performance capability in 40 minutes following the early end to her offsite meeting. The user may use a smartphone application to indicate that full performance is desired 40 minutes in the future. The system may then pair this instruction with other inputs such as a current battery temperature to determine how much pressurizing or depressurizing is needed to bring the battery to full performance level. Another input such as a power delivered by a heater and thermal system or compressible element and pressure system efficiency/characteristics may then be used to determine how long the modifying pressure will take. This duration then determines the time at which modifying pressure should begin.

Another factor that can be relevant in predicting whether driving will occur and determining the optimal pressure conditions relates to past driving history. A vehicle may log all driving history and use such history to determine the probability that a vehicle will be driven at any particular time. Daily, weekly, and monthly routines may be learned in this way. For instance, a user may drive to work starting between 8:15-8:30 most weeks Monday through Friday. This information can be logged and used to help predict whether and when modifying pressure is needed.

Methods for determining confidence levels use input parameters such as those described above as independent variables. The confidence values are dependent variables. The relationship between confidence level and the input parameters may assume many different forms and likewise may be generated by many different tools such as regression techniques, multivariate statistical analysis, and neural networks. The relationship may be linear or non-linear, with linear relationships being represented by simple summations of terms, each containing a product of a single independent variable and a coefficient. In some cases, the coefficients are weighting factors such as those described in Example 10 of U.S. Patent Application Publication No. U.S. 2016/0059733, which was filed Aug. 27, 2015 and entitled "BATTERY THERMAL MANAGEMENT SYSTEM AND METHODS OF USE," and published Mar. 3, 2016, where the input(s) further include pressure consideration, the contents of which are incorporated herein by reference in their entirety. Non-linear relationships have some component (e.g., a term) that is not linear. Examples of non-linear components include terms containing a product of two or more input parameters or an input parameter raised to a power other than 1. In some cases, the values of one or more independent variables are bit values (e.g., 0 or 1). In some cases, the values of one or more independent variables are values within a continuous range. The values may be integers, decimal numerals, fractions, etc. The input parameters and confidence levels are set for a particular expected driving time, and they may repeat on a regular schedule such as daily, weekly, annually, etc. For example, some or all input parameter values may reoccur every weekday at 8 AM or every July 4 at noon. Of course, the values may be adjusted based on feedback or other learning as described below.

In some examples, the methods of predictively modifying pressure of a battery include machine learning. In some examples, the methods of predictively modifying pressure of a battery include a learning algorithm. These methods include, but are not limited to, machine learning, datamining, statistical pattern recognition, supervised learning, parametric/non-parametric algorithms, support vector machines, kernels, neural networks, unsupervised learning, clustering, dimensionality reduction, recommender systems, and deep learning. Applications of these techniques using the principles described herein are within the level of expertise of those skilled in the art.

In some examples, the machine learning includes analyzing a set of inputs, generating a prediction directed to at least one of (a) when an upcoming drive will occur; (b) the level of power that is optimal for the upcoming drive; (c) the degree of pressure modifying that will result in the optimal level of power; and/or (d) the lead time for achieving the optimal degree of pressure modifying/the optimal power level before the predicted time of the upcoming drive, heating/pressuring or depressurizing the battery as predicted, analyzing the actual use and performance of the battery/vehicle, comparing or assessing the actual use/performance of the battery/vehicle with the predicted use/performance, and generating a new prediction directed to at least one of (a)-(d) with respect to a subsequent predicted drive. In this way, the set of data (and the relationships among such data) that are used to predict when and how much to pressurize or depressurize a battery can be continuously updated based on the latest data and relationships. This allows for the battery system to continuously learn from a user (and other available sources), thereby steadily improving its predictive power.

In one example, the machine learning includes analyzing a set of inputs, generating a prediction as to when an upcoming drive will occur and the optimal power level for the upcoming drive, heating or pressurizing or depressurizing the battery as predicted, analyzing when the predicted drive actually occurred and the power that was actually used during the drive (e.g., the max power used, the power vs. time profile over the course of the drive, etc.), comparing or assessing the actual drive time and battery power used with the predicted drive time and battery power, and generating a new prediction as to the timing and/or optimal power level for a subsequent drive.

In many cases, the new prediction reduces the deviation or error between the actual battery performance observed (e.g., the timing of the drive, the battery power used, the amount of pressure modifications provided, and the lead time used for pressure modifications) and the predicted battery performance. In this iterative fashion, the methods set forth herein allow a battery management system, which may include a computer/processor in combination with a compressible element, associated with a battery, to make improved predictions over time; such predictions becoming increasingly accurate as a result of comparing or assessing the differences between predicted pressure modification scenarios and actual pressurizing or depressurizing scenarios. In some examples, the inputs are from a single user and in some examples the inputs are from multiple users. In these or other cases, the inputs may relate to a single vehicle, or to multiple vehicles.

In some examples, inputs from multiple users includes inputs associated with a demographic. For example, a demographic may be defined by people of certain characteristics, such as age, race, education, job type, income level, sex, driving experience, and other characteristics. For example, a demographic may be defined by single men between the ages of 30-35. If this group of men has a characteristic driving pattern, this driving pattern and these inputs from the demographic may be considered when generating a prediction as to when and how much to pressurize or depressurize a battery for other users falling with the definition of the demographic. In a similar example, a demographic may be at least partially defined geographically, such that the driving habits of people in a particular geographic region may inform the predictions. As an example, drivers in a given city tend to be much more aggressive than drivers in outlying rural areas of that given city. These differences can help inform the prediction with respect to the optimal power needed for an upcoming drive.

These inputs may also be referred to as big data inputs. Big data (or demographic inputs) include a characteristic selected from, age, geography of user, education of user, geography of drive(s), income of user, job type of user, driving experience of user, location of user, sex of user, and population density for the demographic in a particular region. For example, in one embodiment, big data includes an age characteristic. By way of further example, in one embodiment, big data includes a geography of user characteristic. By way of further example, in one embodiment, big data includes an education of user characteristic. By way of further example, in one embodiment, big data includes a geography of drive(s) characteristic. By way of further example, in one embodiment, big data includes an income of user characteristic. By way of further example, in one embodiment, big data includes a job type of user characteristic. By way of further example, in one embodiment, big data includes a driving experience of user characteristic. By way of further example, in one embodiment, big data includes a location of user characteristic. By way of further example, in one embodiment, big data includes sex of user characteristic. By way of further example, in one embodiment, big data includes a population density for the demographic in a particular region characteristic. As an example, big data inputs may include the common driving routes that many delivery persons who deliver commercial packages might take. Since these routes are typical driving routes for delivery persons, but may not be typical driving routes for persons who have jobs not requiring commercial deliveries, this information is relevant as an input for a demographic including delivery persons, but is much less relevant as an input for a demographic that is not specific to delivery persons, or which excludes delivery persons.

Inputs can include a variety of information including demographic information as well as other information. In various cases, the information could include employment information. The employment information may include information selected from the type of employment, the annual income, the type of job (e.g., service, legal, medical, professional, nonprofessional, labor, etc.), employment status (e.g., employed, unemployed, employed full time, employed part time), and shift/scheduling information (e.g., day shift, evening shift, night shift, split shifts, etc.). For example, in one embodiment, the employment information is type of employment. By way of further example, in one embodiment, the employment information is annual income. By way of further example, in one embodiment, the employment information is the type of job. By way of further example, in one embodiment, the employment information is employment status. By way of further example, in one embodiment, the employment information is shift/scheduling information. The information may include the vehicle information that pertains to a single user or to a demographic of users. For example, if a demographic is defined by taxi cab drivers, then the relevant other information may include the type of vehicle that taxi cab drivers use for taxi services. Similarly, if a demographic is defined by sports enthusiasts, then the information may include the types (e.g., make, model, body type, etc.) of vehicles commonly used by sports enthusiasts (in many cases high performance vehicles). The vehicle information may also relate to the particular vehicle that is being driven, and may include the type of vehicle, the performance characteristics of the vehicle, the make of the vehicle, the model of the vehicle, and the year the vehicle was manufactured. The information may include the geography where the vehicle is located or the geography where the vehicle is driving towards. The information may include the location of the vehicle, the location of the user, and/or the location of the users defining a demographic that is considered in a predictive pressure modification scenario. The information may include past driving uses, past insurance claims, and other historical information which is indicative of the driving history of a particular user or demographic.

In some examples, a demographic may be defined by (or include information about) certain associations which members of the demographic commonly have. These associations can include, but are not limited to, memberships, club privileges, societies, subscriptions, and interests of the users in the demographic. In one example, an "enthusiast driver" demographic may be defined to include everyone who is subscribed to one or more services (e.g., magazine subscription, blog following, etc.) to driving-related media.

In some examples, the information about a user that is analyzed and used to generate a prediction as to when and/or how much to pressurize or depressurize a battery, may be stored in a variety of locations. For example, the information about a user's driving history may be stored on a memory device physically attached to the vehicle. Alternatively or in addition, the information may be stored in a cloud, or remote server, or a computer, including a smart phone other portable device, remotely associated with, or wired to, a battery. This remotely stored information could be made accessible to a vehicle by a Bluetooth, Wi-Fi, or an internet-based connection. This remotely stored information could be used by a user in a vehicle other than the vehicle which a user typically drives. For example, if a user travels to a new location and rents or shares a vehicle, this rented or shared vehicle can download or access a user's profile to capture the user's historical driving information (and any other available information) and make a prediction as to when and how much to pressurize or depressurize a battery in the rental or shared vehicle. The pressure modification prediction for the rental vehicle can be based on driving and other information generated before the user even enters the rental vehicle. Such information may include the driving history of the user in their primary vehicle, as well as any other available information related to the user. As the user continues to drive the rental car, the information can further include the driving history for the user in the rental car. Similar considerations may come into play when a user drives a loaner car (e.g., from a mechanic or friend), a car sharing car (e.g., through Zipcar and similar companies), etc. Information relevant to making a prediction about modifying pressure of a battery can be stored in a variety of locations such as, but not limited to, a portable memory device, a portable memory RAM chip that can be carried with the user (e.g., in a wallet or other purse and less than about 20 square inch area), a portable computer or tablet, a cloud, a remotely accessible server, a user's phone or smartphone, or combinations thereof. Such driver-specific information may be associated with a user's profile, which may then be accessed and applied to any vehicle driven by the user.

In some embodiments, the information relevant to a user may be stored as a part of an application. Such application may run on the user's smartphone or other electronic device, or on the vehicle directly. Within the application, information relevant to the user may be stored within a profile that is specific to that user (or to that vehicle, for example). In one example, the application may include additional functionality that allows a user track the instantaneous location of the vehicle and/or the driving habits of a user. For instance, the application may allow a parent to track the whereabouts of their teenager by tracking the location of the car. The parent may also be able to track the driving habits of the teenager using information collected while the teen drives.

In some examples, a user owns more than one vehicle. For example, a wife may own two vehicles, but share these vehicles with her husband. In some examples, input information from both users (e.g., wife and husband) is used to make a prediction about one or both of the users' driving and pressure modification requirements. In some examples, the driving data from multiple vehicles is pooled to make a prediction about a single user in a single vehicle. For example, input information from the wife's use of both vehicles can be used to make a prediction about one of the vehicles that the wife happens to be driving on a given day.

In some methods set forth herein, the methods include an input step where information is provided for making a prediction about when and how much to pressurize or depressurize a battery. The methods may further include analyzing the information provided and generating a prediction regarding when and how much to pressurize or depressurize a battery. The methods may further include generating a comparison between the prediction and the actual performance of the battery (e.g., time of a drive, battery power used for the drive, pressure modifications applied, lead time used, heating performance, pressure performance, driving performance, discharge or charge performance, etc.). Based on this comparison, a refinement on the first prediction is made so as to improve subsequent predictions with respect to accuracy. By including these steps, for example, the computer or management system which controls the battery can learn about a user and make more accurate pressurizing or depressurizing predictions as time progresses. This learning can include machine learning, data-mining, statistical pattern recognition, supervised learning (e.g., parametric/non-parametric algorithms, support vector machines, kernels, neural networks) and unsupervised learning (e.g., clustering, dimensionality reduction, recommender systems, deep learning).

In certain embodiments, the calculating a current SOH includes optimizing power performance, wherein optimizing power performance includes the steps of: (i) determining a current pressure condition by sensing pressure of the battery cell; (ii) comparing the current pressure condition with a threshold pressure value to provide a pressure comparison result; (iii) determining whether a safety condition exists based on the pressure comparison result relative to the threshold pressure value; (iv) determining whether the pressure comparison result is normal or not normal, and whether the normal or not normal condition further comprises a safety condition or no safety condition; (v) applying a fourth pressure to the battery system if the pressure comparison result fails to exceed the threshold pressure value and is not normal and a safety condition exists; (vi) depressurizing the battery system if the pressure comparison result exceeds the threshold pressure value and is not normal and a safety condition exists; or (vii) depressurizing the battery system if the pressure comparison result exceeds the threshold pressure value and is not normal; wherein application of the pressures is indicative of suboptimal power performance, and depressurization is indicative of optimal power performance. For example, in one embodiment, calculating a current SOH includes factoring in an existing pressure. By way of further example, in one embodiment, calculating a current SOH includes factoring in a magnitude of an existing pressure. By way of further example, in one embodiment, calculating a current SOH includes factoring in a uniform existing pressure. By way of further example, in one embodiment, the ASR is a DC or series resistance.

In certain embodiments, the battery environment may have an effect on the pressure of the battery system. For example, the pressure of the battery system is related to the temperature of the battery system, as would be appreciated by a person of skill. Accordingly, changes to the temperature will affect battery pressure. For example, in one embodiment, the method for pressurizing or depressurizing the battery system further includes changing the temperature of the battery system, including the following steps: determining a temperature of the battery system or cell, and modulating the temperature of the battery system by starting or stopping one or more heaters, heat pumps, or changing the flow of fluid (e.g., water/glycol, air) used to regulate the temperature (e.g., heating or cooling) of the battery or battery cell. In certain embodiments, the method for pressuring or depressurizing a battery system further includes reducing power availability if the comparison result is not normal, or abnormal, and a safety condition exists by: communicating an instruction or a safe message instruction to the driver to reduce power, or communicating a control message to a controller to reduce power, or communicating a control message to a controller to reduce pressure on the electrochemical cell. For example, in one embodiment, modulating the temperature of the battery system includes heating the battery. By way of further example, in one embodiment, modulating the temperature of the battery system includes cooling the battery.

In certain embodiments, the depressurizing results in a shutdown of the battery system. For example, in one embodiment, the method includes sending instructions to at least one member selected from the group consisting of a driver, an OEM, and a maintenance operator, where the instructions are for actuating compressible elements to depressurize the battery system. By way of further example, in one embodiment, method includes sending instructions to at least a driver where the instructions are for actuating compressible elements to depressurize the battery system. By way of further example, in one embodiment, method includes sending instructions to at least an OEM, where the instructions are for actuating compressible elements to depressurize the battery system. By way of further example, in one embodiment, method includes sending instructions to at least a maintenance operator, where the instructions are for actuating compressible elements to depressurize the battery system. By way of further example, in one embodiment, the method includes one or more compressible elements and further comprising sending instructions to at least one member selected from the group consisting of a driver, an OEM, and a maintenance operator; wherein the instructions are for actuating one or more compressible elements to depressurize the battery system. By way of further example, in one embodiment, the method includes sending instructions to a driver, where the instructions are for actuating compressible elements to depressurize the battery system. By way of further example, in one embodiment, the method includes sending instructions to an OEM, where the instructions are for actuating compressible elements to depressurize the battery system. By way of further example, in one embodiment, the method includes sending instructions to a maintenance operator, where the instructions are for actuating compressible elements to depressurize the battery system. By way of further example, in one embodiment, the method further includes disengaging one or more hybrid vehicle contactors (e.g., lead tabs) from a rechargeable battery.

In certain embodiments, applying the first pressure includes sending a control message to the at least one member selected from the group consisting of a driver, an OEM, a maintenance operator, an actuator, or a pressure transducer configured to apply pressure to the battery system. For example, in one embodiment, applying the first pressure includes sending a control message to a driver. By way of further example, in one embodiment, applying the first pressure includes sending a control message to an OEM. By way of further example, in one embodiment, applying the first pressure includes sending a control message to a maintenance operator. By way of further example, in one embodiment, applying the first pressure includes sending a control message to an actuator. By way of further example, in one embodiment, applying the first pressure includes sending a control message to a pressure transducer configured to apply pressure to the battery system.

In certain embodiments, the condition is one selected from the group consisting of normal, abnormal, safe, non-safe, and shutdown, and combinations thereof. For example, in one embodiment, the condition is normal. By way of further example, in one embodiment, the condition is abnormal. By way of further example, in one embodiment, the condition is safe. By way of further example, in one embodiment, the condition is non-safe. By way of further example, in one embodiment, the condition is shutdown. By way of further example, in one embodiment, the condition is normal and safe. By way of further example, in one embodiment, the condition is normal and non-safe. By way of further example, in one embodiment, the condition is abnormal and safe. By way of further example, in one embodiment, the condition is abnormal and non-safe. By way of further example, in one embodiment, the condition is normal and shutdown. By way of further example, in one embodiment, the condition is abnormal and shutdown. By way of further example, in one embodiment, the condition is non-safe and shutdown.

In certain embodiments, the conditions described in the preceding paragraph may be assigned a numeric value, for example, a number between 0% and 100%. For example, in one embodiment, the condition is 0, 1, 2, 3, 4, 5, 6, 7, 8, 9, 10, 11, 12, 13, 14, 15, 16, 17, 18, 19, 20, 21, 22, 23, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, and 100% normal with respect to SOH. By way of further example, in one embodiment, the condition is 0, 1, 2, 3, 4, 5, 6, 7, 8, 9, 10, 11, 12, 13, 14, 15, 16, 17, 18, 19, 20, 21, 22, 23, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, and 100% abnormal with respect to SOH. By way of further example, in one embodiment, the condition is 0, 1, 2, 3, 4, 5, 6, 7, 8, 9, 10, 11, 12, 13, 14, 15, 16, 17, 18, 19, 20, 21, 22, 23, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, and 100% safe with respect to SOH. By way of further example, in one embodiment, the condition is 0, 1, 2, 3, 4, 5, 6, 7, 8, 9, 10, 11, 12, 13, 14, 15, 16, 17, 18, 19, 20, 21, 22, 23, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99, and 100% non-safe with respect to SOH. By way of further example, in certain embodiments, combinations of conditions having the same or different numeric values have been contemplated. Nonlimiting examples, include 40% normal and 40% safe with respect to SOH, and 40% normal and 60% safe with respect to SOH. Other combinations have been contemplated.

In certain embodiments, the depressurizing results in an unsafe condition and a shutdown of the battery system. For example, in one embodiment, the de-pressurizing results in a shutdown of the battery system. By way of further example, in one embodiment, the method includes sending instructions to at least one member of emergency services, for example, fire department, police department, hospital (e.g., ambulance service), and vehicle repair service (e.g., AAA, tow company, etc.) where the instructions are for actuating compressible elements to depressurize the battery system. By way of further example, in one embodiment, the method includes sending instructions to a fire department, where the instructions are for actuating compressible elements to depressurize the battery system. By way of further example, in one embodiment, the method includes sending instructions to a police department, where the instructions are for actuating compressible elements to depressurize the battery system. By way of further example, in one embodiment, the method includes sending instructions to a hospital (e.g., ambulance service), where the instructions are for actuating compressible elements to depressurize the battery system. By way of further example, in one embodiment, the method includes sending instructions to a vehicle repair service (e.g., AAA, tow company, etc.), where the instructions are for actuating compressible elements to depressurize the battery system. By way of further example, in one embodiment, the method further includes disengaging one or more hybrid vehicle contactors from a rechargeable battery.

An exemplary battery management system (BMS) includes, generally, a microprocessor and a memory. The memory is operatively connected via a high speed bus to a processor so that its memory can be addressed by computing elements in the processor. Other peripheral systems, such as a processing acceleration unit, an I/O subsystem, a storage subsystem, and a communications subsystem can be connected as well to the processor. A storage subsystem can include tangible, non-transitory computer-readable storage media and a system memory.

The processor, which can be implemented as one or more integrated circuits, such as a conventional microprocessor or microcontroller, controls the operation of the battery management computer system. One or more processors may be included in a processing unit. These processors may include single core or multicore processors. In certain embodiments, the processor can be implemented as one or more independent processing units with single or multicore processors included in each processing unit. In other embodiments, the processor can also be implemented as a quad-core processing unit formed by integrating two dual-core processors into a single chip.

The processor can execute different programs in response to program code and, in some configurations, can maintain multiple concurrently executing programs or processes. At any given time, some or all of the program code to be executed can be resident in the processor and/or in the memory.

In some embodiments, the controller includes control logic, which may be implemented using a processor, card, memory, board, network connection, or a combination of any of these. In general, the control logic used to control the controller can be designed or configured in hardware and/or software. In other words, the instructions for controlling the apparatus may be hard coded or provided as software. It may be said that the instructions are provided as "programming." Such programming is understood to include logic of any form including hard coded logic in digital signal processors and other devices which have specific algorithms implemented as hardware. Programming is also understood to include software or firmware instructions that may be executed on a general purpose processor. In certain embodiments, the control logic is partially or fully implemented in a processor such as a programmable logic device (PLD), field programmable gate array (FPGA), application specific integrated circuit (ASIC), general purpose microprocessor, or similar integrated circuit. In some embodiments, instructions for controlling are stored on a memory device associated with the controller or are provided over a network. Examples of suitable memory devices include semiconductor memory, magnetic memory, optical memory, and the like. The computer program code for controlling, for example, battery metrics including without limitation battery pressure, can be written in any conventional computer readable programming language. Compiled object code or script is executed by the processor to perform the tasks identified in the program.

Feedback and Refinement

As noted with reference to Table 1, each input parameter may be assigned a relative importance factor, which defines how to weigh the input in the determination of time of expected drive start/confidence level/expected duty cycle/power level. As the vehicle is used over time and the control system is tested repeatedly, a memory device in the control system may record actual drive starts, pressure readings, and battery system duty cycles and compare them with predicted drive starts, predicted or prior pressure readings, and battery system duty cycles. This data allows the control system to continually refine the values of relative importance factors for each type of data and combination of data to continuously improve the predictive power of the method. The pre-determined importance factors (e.g., initial importance factors such as those from a manufacturer) and usage-based importance factors (e.g., importance factors based on analysis of actual driving patterns) are analyzed to come up with a combined importance factor, which can be used in future predictions of start time, battery pressure, and battery system duty cycle. In other words, the determination of whether and when driving will occur, the determination of battery pressure, and the determination of a desired power level for an upcoming drive, can be improved through feedback that evaluates past predictions and compares them to a vehicle's actual driving record. This feedback, over time, favors the most predictive inputs and combinations of inputs, such that over time a battery control system may learn to predict driving patterns with a very high degree of accuracy based on factors (e.g., input parameters and relative importance factors) that may be particular to an individual user.

Use of Pressure to Extend Battery Life

Calculating the SOH, determining the comparison value(s) and comparison result(s), determining a condition(s), and applying a pressure(s) are the same as described herein where each of these method steps are used to extend the life of the battery system as a function of pressure. For instance, a determination that the battery needs decreased pressure to extend the life of the battery includes depressurizing the battery when the battery is at full charge and not in use. In another instance, a determination that the battery needs increased pressure to extend the life of the battery includes pressurizing the battery to maintain the structural integrity of battery components. In some instances, the solid separator electrolyte may structurally fail as a result of pressure fluctuations, leading to overall battery failure. Pressurizing the battery keeps the structural integrity of the solid separator electrolyte intact, thereby prolonging battery life.

Use of Pressure for Installation or Maintenance

The installation of the battery is dependent upon pressure status considerations for the battery. Accordingly, calculating the SOH, determining the comparison value(s) and comparison result(s), determining a condition(s), and applying a pressure(s) are the same as described herein, where each of these method steps are used to depressurize the battery to allow for the installation of the battery; and re-pressurization of the battery after the battery is installed and ready for use. Similarly, maintenance of the battery is determined by calculating the SOH, determining the comparison value(s) and comparison result(s), determining a condition(s), and applying or removing a pressure(s) as described herein, where each of these method steps are used to depressurize a battery when a maintenance determination is made to allow for removal of the battery from the device. Accordingly, upon the completion of maintenance, the battery is re-installed and re-pressurized as described above. Installation and maintenance is performed by the OEM or other suitable technician, or the driver. For example, in one embodiment, adjusting the pressure in the battery system to meet battery specifications is during charging. By way of further example, in one embodiment, adjusting the pressure in the battery system to meet battery specifications is during discharging.

Use of Pressure for Shipment

Shipment of the battery is dependent upon pressure status considerations for the battery. Accordingly, calculating the SOH, determining the comparison value(s) and comparison result(s), determining a condition(s), and applying a pressure(s) are the same as described herein, where each of these method steps are used to depressurize the battery to allow for shipping of the battery by the OEM or other suitable technician, or driver; and re-pressurization of the battery after the battery is shipped, installed, and ready for use. Similarly, safely shipping the battery in the event of mishandling is determined by calculating the SOH, determining the comparison value(s) and comparison result(s), determining a condition(s), and applying or removing a pressure(s) as described herein, where each of these method steps are used to depressurize a battery when a repair or maintenance determination is made to allow for removal of the battery from the device. Accordingly, upon the completion of repair or maintenance, the battery is re-installed and re-pressurized as described above. For example, in one embodiment, the method for shipping a battery system includes the battery system having charged batteries.

EMBODIMENTS

Embodiment 1

A method for secondary battery pressure management in a vehicle, the method comprising: using input parameters; predicting a plurality of performance requirements for a battery of the vehicle using a respective plurality of sets of values for the input parameters and a weighting factor assigned to each of the input parameters; for at least one of the predicted performance requirements, sending a control signal to a dynamic compressible element for modifying a pressurization of the battery according to the at least one of the predicted performance requirements; logging a plurality of actual performance requirements; and refining a predictive capability for battery performance requirements including, for each actual performance requirement, modifying the weighting factors assigned to the input parameters as a function of the respective actual performance requirement and predicted performance requirement.

Embodiment 2

The method of Embodiment 1, wherein an actual performance requirement comprises an actual battery duty cycle and/or an actual driving record for the vehicle.

Embodiment 3

The method of Embodiment 1, wherein the predicting step further includes, for each of the predicted performance requirements, determining a pre-pressurization threshold for the predicted performance requirement, the pre-pressurization threshold reflecting at least a battery power demand and energy availability for pre-pressurization, wherein the pre-pressurization threshold is determined from a summation of products of the weighting factors and a binary number representing the presence or absence of the value for the corresponding input parameter, comparing the pre-pressurization threshold to a confidence level, the confidence level reflecting a likelihood that the vehicle will be driven at a predicted start time, and if the confidence level is greater than the pre-pressurization threshold, sending the control signal according to the at least one predicted performance requirement.

Embodiment 4

The method of Embodiment 3, wherein the confidence level is determined from one or more of calendar information, a cell phone message, historical drive times, a weather forecast, a battery status, driver inputs, an upcoming drive type, a destination type, and a time of day.

Embodiment 5

The method of Embodiment 1, wherein the pre-pressurization threshold is determined from one or more of a battery state of charge (SoC), a location of the vehicle, a battery temperature, a user input driving preference, whether the battery is currently being externally charged, a length of an expected drive, current electricity price, and a type of expected drive.

Embodiment 6

The method of Embodiment 1, wherein the input parameters comprise one or more of: vehicle use information selected from the group consisting of statistical probability of drive starts as a function of previous drive start, drive times, time of drive starts, drive lengths, drive routes, geography of drives, driving pattern information, past battery warming conditions, past vehicle performance conditions, past battery performance conditions, feedback information, and combinations thereof, location information selected from the group consisting of driver location, passenger location, driver location with respect to vehicle location, passenger location with respect to vehicle location, GPS location of user's smartphone, GPS/Wi-Fi/cellular location of fob, proximity of fob to vehicle, GPS/Wi-Fi/cellular location of vehicle key, proximity of vehicle key to vehicle, user's proximity to the vehicle, location of the vehicle, driver location with respect to home, driver location with respect to airport, driver location with respect to work place, driver location with respect to common drive locations, driver location with respect to preselected destinations, driver location with respect to saved destinations, and combinations thereof, drive types selected from the group consisting of start location of drives, end location of drives, total distance of drives, average distance of drives, velocity of drives, average velocity of drives, traffic conditions of drives, and combinations thereof, temperature information selected from the group consisting of battery temperature, ambient temperature, vehicle temperature, and combinations thereof, heating device, battery, and/or vehicle information selected from the group consisting of battery energy capacity, state of charge of battery, battery self-discharge rate, a relationship between two or more of power of battery, temperature of battery, state of charge of battery, and age of battery, a thermal time constant for the battery, capacity of the heating device, efficiency of the heating device, powertrain of vehicle, thermal system configuration of vehicle, motor power of vehicle, powertrain efficiency of vehicle, vehicle minimum power output level for safe driving, and combinations thereof, weather information selected from the group consisting of current weather conditions, weather forecast, temperature, precipitation, visibility, and combinations thereof, driver inputs selected from the group consisting of immediate start instructions, delayed start instructions, start cancelation instructions, a user-specified performance level, and combinations thereof, user information selected from the group consisting of driver's calendar information, passenger's calendar information, smartphone information, historical use information, and combinations thereof, external information selected from the group consisting of information acquired from emails on user's wireless communication device, information acquired from texts on user's smartphone, and combinations thereof, traffic information selected from the group consisting of traffic conditions, road conditions, construction conditions, detour conditions, and combinations thereof, calendar information selected from the group consisting of day of the week, month of the year, holiday information, and combinations thereof, optionally in combination with a user specified performance level, charging equipment availability information selected from the group consisting of availability of charging equipment at vehicle's current location, availability of charging equipment at vehicle's expected destination, and combinations thereof, optionally in combination with a status of an additional transportation provider and/or a status of an additional transit option, and combinations thereof.

Embodiment 7

The method of Embodiment 1, wherein for each of the predicted performance requirements, further including the steps of: determining one or more power levels required from the battery for matching the predicted performance requirement, and calculating a respective one or more battery pressures for each of the one or more power levels, and wherein the generated at least one control signal for pressurizing the battery contains the respective one or more calculated battery pressures.

Embodiment 8

The method of Embodiment 1, wherein at least one of the predicted performance requirements comprises a plurality of types of driving, such that a respective plurality of power levels are determined for matching with each of the types of driving, and a respective plurality of optimal battery pressurizations are calculated for each of the power levels.

Embodiment 9

The method of Embodiment 8, wherein a single predicted driving route comprises the plurality of power levels and respective plurality of calculated optimal battery pressures.

Embodiment 10

The method of Embodiment 9, wherein the plurality of driving types is city driving and highway driving.

Embodiment 11

A secondary battery thermal management system, comprising: a vehicle including a battery; instructions for performing the method according to Embodiment 1; a processor configured for executing the instructions, wherein the control signal is sent to a heating device or to the battery to initiate a heating of the battery; and a memory device recording the logged plurality of actual performance requirements.

Embodiment 12

The system of Embodiment 11, wherein the vehicle battery is a lithium ion secondary battery.

Embodiment 13

The system of Embodiment 12, wherein the lithium ion secondary battery comprises a cathode comprising conversion chemistry active materials.

Embodiment 14

The system of Embodiment 12, wherein the lithium ion secondary battery comprises a cathode comprising lithium intercalation chemistry active materials.

Embodiment 15

The system of Embodiment 11, wherein the vehicle battery is a secondary battery comprising a solid-state electrolyte.

Embodiment 16

The system of Embodiment 11, wherein the system includes a battery control module comprising the processor and the memory device.

Embodiment 17

The system of Embodiment 11, the battery control module further comprising: a communication interface for receiving signals from external devices and/or sensors, wherein values for the input parameters are received from the from external devices and/or sensors, wherein the battery control module is configured to send the control signals to a heating element for heating the vehicle battery.

Embodiment 18

The system of Embodiment 11, wherein the processor and/or the memory device is included with the vehicle.

C. EXAMPLES

Example 1—De-Pressurization of the Battery System at High SOC When Not in Use

To maximize the calendar life of a battery, a battery management system is used to determine the state-of-health (SOH), pressure, and SOC of the battery, and upon determination of a high SOC, the battery system de-pressurizes the battery, for example, when the battery is not in use. Certain detrimental characteristics can give rise to one or more safety conditions and include, without limitation, capacity fade linked to excessive pressure when the battery is not in use. For example, loss of liquid or gel ion conductor from the cathode electrode into the volume of the battery cell between the electrochemical stack(s) and the cell enclosure occurs when excessive pressure exists and the battery system is not actively used. Loss of ion conductor will result in an increase in cell resistance, reducing power capability and capacity at a given rate, and constitute an abnormal and/or unsafe condition(s). A battery management system (BMS) computer with embedded software or firmware can execute many of the described operations based on at least one input which includes a pressure measurement. The BMS calculates the battery SOH from any one or more reference comparison values for OCV, resistance, capacity, temperature, calendar life, pressure, and/or historical use of the battery, each stored in an on-board memory and based on a pressure input value. The reference comparison value(s) are pre-stored in the memory or retrieved from a prior measurement for the comparison value(s) that was stored in the memory. The BMS then takes an updated pressure measurement and/or OCV, resistance, capacity, or temperature measurement for a comparison value(s) from a sensor configured to provide the metric value and compares the updated comparison value(s) to the stored comparison value(s) and determines a comparison result(s) for the battery SOH. The BMS determines the battery SOC and pressure. The on-board memory contains a pre-stored, threshold comparison value for high SOC. When the BMS determines that the updated SOC measurement is above the threshold comparison value for high SOC, and the pressure comparison result is concomitantly high, the BMS then communicates a signal for an abnormal condition and/or an unsafe condition, and a signal to release pressure from the battery to reduce mechanical strain on the battery. These operations are performed when the battery is in-use or when the battery is not in-use.

Example 2—Determination of Desired Battery Power is Less Than Available Battery Power The BMS as in Example 1 is used to determine battery power and battery power needs. The BMS calculates the battery SOH as in Example 1. The BMS then calculates battery power and pressure in a similar manner. When the BMS determines that the desired battery power is less than the available battery power, the BMS then communicates a signal to increase battery power, increase pressure, increase temperature, increase battery power and battery pressure, increase battery power and battery temperature, increase battery power and battery pressure and battery temperature, as needed. Any of the aforementioned signals to modify battery attributes/conditions will economize energy use, such as less heating, but increased pressurizing of the battery system.

Example 3—Battery Healing

The BMS as in Example 1 is used to determine battery health and battery health needs. The BMS calculates the battery SOH as in Example 1. The BMS then calculates battery health and pressure in a similar manner.

When the BMS determines that the desired battery SOH is less than the preferred or prior battery SOH, the BMS then communicates a signal to increase battery pressure, temperature, each for independent time periods, as needed, to improve cell state of health. More specifically, when the interface between to battery components is compromised (e.g., between the cathode and the solid-state electrolyte, leading to increased ASR), the BMS then communicates a signal to independently increase or decrease battery pressure and temperature, each for independent time periods, as needed, to improve cell state of health with respect to reduction in ASR (i.e., establish reflow between the interface(s) of two or more battery components). Any of the aforementioned signals to modify battery attributes/conditions will economize energy use and battery health.

Example 4—Battery Pressure Management

In this example, the control system analyzes the plurality of parameters and pressure readings set forth herein, including when the driver is likely to drive. These parameters, in one example, include the proximity of the driver's cell phone with respect to the vehicle or whether or not the cell phone is turned on. During the time that the cell phone, with the user, approaches the vehicle, the battery is pressurized or depressurized so that it is at a predetermined level when the driver arrives at the vehicle.

Figure 4:
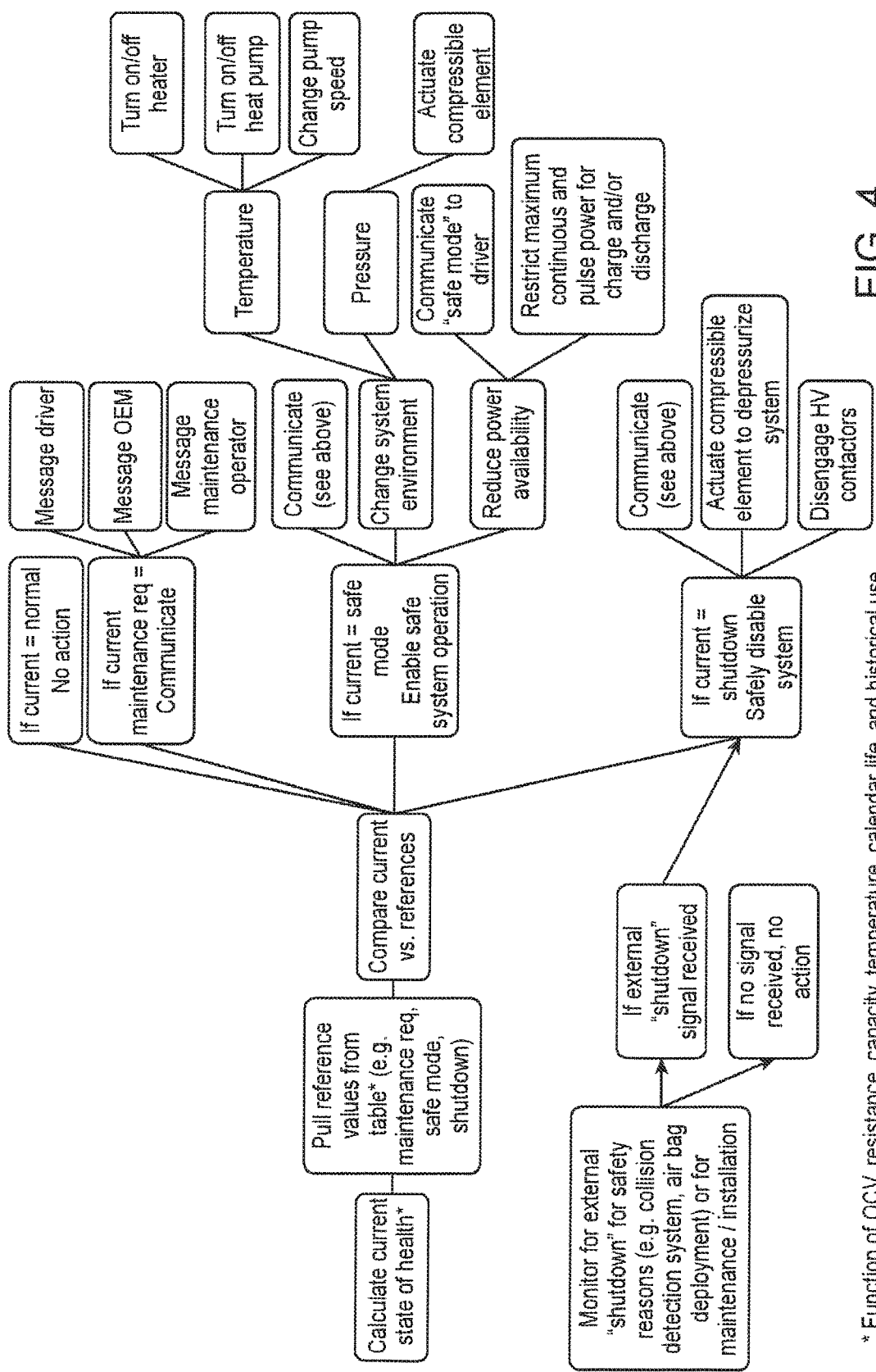
FIG. 4 shows one embodiment of a block diagram for a battery pressure method set forth herein.

FIG. 4 presents an example method for determining whether and when to modify pressure of a battery of a vehicle. In this example, the input parameters include signals from one or more external devices, historical driving record (e.g., historical drive start times and historical drive durations, etc.), current weather and forecast information, the current temperature of the battery, the current pressure of the battery, user inputs such as preferences, typical probability of drive starts, typical drive times and types, and other inputs. The method uses these inputs to determine a current state of health (e.g., as a function of OCV, resistance, capacity, temperature, pressure, and calendar life, among other inputs or data), an expected start time and a confidence level that a drive will occur at the expected start time. The method may rank, compare and otherwise analyze the various input parameters to determine one or more comparison values, an expected drive start time and probability of correctness (e.g., the probability that a drive will start for each time over a given time window), as well as the desired power level. The desired power level is discussed further below. Generally speaking, the desired power level is determined by the type of drive that is predicted and the power level optimal for such a predicted drive type. The various inputs may also be used to determine the probability threshold (i.e., a pre-warming threshold, a pre-pressurization threshold, or a pre-depressurization threshold). As noted above, if the confidence level that a drive will start at an expected start time exceeds the probability threshold, pre-warming or pressure modification will occur to warm and/or pressurize the battery to a desired temperature and/or pressure with a sufficient lead time such that pre-warming or pre-pressurization (or pre-depressurization) is complete by the desired time (i.e., the time at which the confidence level of starting a drive exceeds the probability threshold). In the event insufficient time exists to warm or appropriately pressurize the battery system to the pre-determined level, the system will seek to minimize the difference between the actual battery temperature and/or pressure achieved and the temperature and/or pressure that was pre-determined to be optimal. In some cases, the probability threshold may be set for a given system (i.e., a static threshold is used, rather than a dynamically calculated threshold). Other inputs that may be useful for determining the probability threshold include user inputs (e.g., user input probability threshold, user input preferences, etc.), and historical probability of correctness. The historical probability of correctness refers to the previous correctness of the method in predicting drive start times. The historical probability of correctness may be useful in refining a method used to determine the probability that a drive will start at a given time (i.e., the confidence level). Such feedback-based improvements are discussed elsewhere herein.

For instance, a user owns a 5-year old Tesla with a 300 kW motor and a battery system, when purchased new, stored 100 kW. Now 5 years old with 24,000 kWh of cumulative historical use, the battery in the Tesla at room temperature and 100% SOC measured to have 90 kWh of capacity, 250 mOhms of resistance, and a current is pressure of 41.3 psi. The method determines these parameters by reading them from their corresponding sensors. The method then calculates a SOH, and compares the current SOH (based on the SOC, capacity, and pressure inputs) with historical or reference inputs, and generates a comparison value(s) for each parameter. According to Table 2 below, the battery system would be rated to a 90% SOH.

TABLE 2

Normal battery system values as a function of time, @ room temperature and 100% SOC

| Calendar time (years) | Cumulative throughput (MWh) | Capacity (kWh) | Resistance (mOhms) | Pressure (psi) | State of health |
|---|---|---|---|---|---|
| 0 | 4 | 100 | 200 | 40.0 | 100% |
| 1 | 8 | 98 | 210 | 40.3 | 98% |
| 2 | 12 | 96 | 220 | 40.5 | 96% |
| 3 | 16 | 94 | 230 | 40.8 | 94% |
| 4 | 20 | 92 | 240 | 41.0 | 92% |
| 5 | 24 | 90 | 250 | 41.3 | 90% |
| 6 | 28 | 88 | 260 | 41.5 | 88% |
| 7 | 32 | 86 | 270 | 41.8 | 86% |
| 8 | 36 | 84 | 280 | 42.0 | 84% |
| 9 | 40 | 82 | 290 | 42.3 | 82% |
| 10 | 44 | 80 | 300 | 42.5 | 80% |
| 11 | 48 | 78 | 310 | 42.8 | 78% |
| 12 | 52 | 76 | 320 | 43.0 | 76% |

These comparison values are used to generate a comparison result, where a condition for the battery is then determined. Based on the condition of the battery, the battery is then pressurized, depressurized, heated, or cooled, among other battery modifications. Corresponding reference values for 'maintenance,' 'safe mode,' and 'shutdown' are then compared vs. the currently conditions. In the example Table 3 below, the battery system characterized in the preceding paragraph would be rated 'normal.' If the pressure, instead was measured to be between 43 and 45 psi, maintenance is required and this message would be communicated, e.g. to the driver, OEM, and the maintenance department of the nearest and the preferred local dealerships. If the pressure, instead, was measured between 45 and 47 (a higher level that may indicate abnormal expansion of the battery system cells, perhaps due to an accelerated or unintended electrochemical side reactions), the system would move into safe mode and, for example, communicate this mode to the same audience as in the preceding example, actuate the compressible element to reduce system pressure to remove excessive mechanical strain from the cells, and reduce maximum power available for charge and discharge until the condition is corrected. If the pressure instead was measured above 47 psi, this may indicate an unsafe condition in the battery system whose condition is communicated after which a system is shutdown is executed by either disengaging the high voltage contactors on the system and/or actuating the compressible element to completely de-pressurize the system.

TABLE 3

Battery System reference Table corresponding to 5 years & 24 MWh throughput, room temperature, 100% SOC

| Mode | Capacity (kWh) | Resistance (mOhms) | Pressure (psi) |
|---|---|---|---|
| shut down | 68 | 175 | 35 |
| safe mode | 77 | 200 | 37 |
| Maint req'd | 83 | 225 | 39 |
| normal | 90 | 250 | 41 |
| maint req'd | n/a | 275 | 43 |
| safe mode | n/a | 300 | 45 |
| shut down | n/a | 325 | 47 |

Example 8—Use of Pressure to Enhance Performance

Calculating the SOH, determining the comparison value(s) and comparison result(s), determining a condition(s), and applying a pressure(s) are the same as in Example 7, above, where each of these method steps are used to enhance the performance of the battery system as a function of pressure. For instance, as an example (see Table 4 below), if a battery system pressurized to 50 psi and at a temperature of 0° C. has available power at an e-rate of 2.5 (less than the desired e-rate of 4 for an anticipated merge onto the freeway the system could optionally use a heater to increase temperature to 20° C. or alternatively increase pressure to 100 psi and increase temperature to 10° C.

TABLE 4

E-rate for a battery system as a function of pressure and temperature

| | | Temp (° C.) | | | | | |
|---|---|---|---|---|---|---|---|
| | | −20 | −10 | 0 | 10 | 20 | 30 |
| Pressure (PSI) | 25 | 0.6 | 1.3 | 2.1 | 3.0 | 3.8 | 4.3 |
| | 50 | 0.8 | 1.5 | 2.5 | 3.5 | 4.5 | 5.0 |
| | 75 | 0.8 | 1.7 | 2.8 | 3.9 | 5.0 | 5.5 |
| | 100 | 0.9 | 1.7 | 2.9 | 4.0 | 5.2 | 5.8 |
| | 125 | 0.9 | 1.8 | 3.0 | 4.1 | 5.3 | 5.9 |
| | 150 | 0.9 | 1.8 | 3.0 | 4.2 | 5.4 | 6.0 |

Example 9—Battery Pressure Management

FIG. 5 presents another example illustrating the various inputs and outputs in one example embodiment. Here, the inputs include signals from electronic device(s), for instance signals related to a user's presence and/or proximity to a vehicle, any communication made from an electronic device to the vehicle, the vehicle's location, information regarding a user's destination, information regarding traffic, information regarding weather, a customer indicated probability threshold or preferences on such threshold, a customer indicated start time, electricity pricing, battery information, grid connection status, and drive history vs. past predictions. Any combination of these inputs may be used. A model is used to determine, from the various inputs that are present, a predicted time for the next drive (along with an associated confidence level), and the power that such a predicted drive is expected to utilize. The confidence level is compared with the probability threshold (which may be pre-set or dynamically calculated). If the confidence level that a drive will occur at a particular time exceeds the probability threshold, a decision to pressurize or depressurize is made. If this decision is made, the inputs may also be used to determine at what time pressure modifying should begin, to what temperature the batteries should be heated, and in some cases an optimal heating, pressurizing, or depressurizing method. The predictions (e.g., whether to pressurize, depressurize, the end pressure, the pressure lead time, heat, the pre-heating end temperature, the pre-heating duration/lead time) can be recorded/logged, along with the various inputs that were used to determine these predictions. The predictions can be compared against the actual driving record (whether driving occurred as predicted, the amount of power that was actually needed/used, actual pre-heating duration, actual pressurizing duration, etc.), and the method of determining the predictions can be refined. This feedback-based refinement is discussed elsewhere herein. In various embodiments, machine learning techniques may be used to implement the feedback-based refinement. The machine learning techniques may include support vector machines, neural networks, regression techniques, Bayesian techniques, probabilistic graphical models, random forest algorithms, gradient boosted machines, ensembles of methods, etc.

Certain combinations of the inputs shown in FIG. 5 are expected to be particularly useful. Though certain combinations of inputs are highlighted, it should be understood that any combination of available inputs may be used without departing from the scope of the disclosed embodiments. In various embodiments, the inputs include (optionally among other inputs) any combination of (a) signals from an electronic device (e.g., signals relating to a user's presence/location or proximity to a vehicle), (b) device to vehicle communication (e.g., information originating in a user's text messages, emails, calendar, Google Now information, etc.), (c) information regarding a user's destination, (d) information regarding traffic, (e) information regarding weather, (f) and a user indicated probability threshold or preferences on such threshold/battery management system.

In a similar embodiment, the inputs may include (optionally among other inputs) any combination of (a) device to vehicle communication, (b) vehicle location, (c) information regarding a user's destination, (d) and information related to traffic.

The embodiments and examples described above are intended to be merely illustrative and non-limiting. Those skilled in the art will recognize or will be able to ascertain using no more than routine experimentation, numerous equivalents of specific compounds, materials, and procedures. All such equivalents are considered to be within the scope and are encompassed by the appended claims.

What is claimed is:

1. A container comprising:
at least one battery module, wherein the at least one battery module comprises: one or more electrochemical cells each comprising a lithium metal negative electrode or a thin film solid-state separator electrolyte, or both;
a pressure sensor and a compressible element, wherein the compressible element is a gas, liquid, or both a gas and a liquid, wherein the compressible element is configured to expand and contract; and
at least one controller;
wherein the pressure sensor and the compressible element are between an inner wall of the container and an outer wall of the one or more electrochemical cells, wherein the compressible element is in contact with both the inner wall of the container and the outer wall of at least one of the one or more electrochemical cells, and wherein:
the side of the inner wall opposite the side in contact with the compressible element is in contact with the lithium metal negative electrode or a thin film solid-state separator electrolyte;
the pressure sensor is in electrical communication with the at least one controller; and
the pressure sensor monitors pressure in the container and the compressible element is configured to maintain an isostatic pressure on the one or more electrochemical cells.

2. The container of claim 1, wherein the one or more electrochemical cells share a solid-state separator electrolyte.

3. The container of claim 1, wherein the compressible element is in electrical communication with the at least one controller.

4. The container of claim 1, wherein the at least one battery module comprises the thin film solid-state separator electrolyte, wherein the thin film solid-state separator electrolyte comprises lithium-stuffed garnet.

5. The container of claim 4, wherein the compressible element is configured to apply an isostatic pressure to the solid-state separator electrolyte in the one or more electrochemical cells.

6. An electric vehicle comprising the container of claim 1.

7. A method for pressurizing or de-pressurizing a battery system comprising the following steps:
providing a container of claim 1;
determining a condition by sensing pressure of the battery cell;
calculating a current state of health (SOH) for the battery system based on the condition and battery metrics;
providing one or more comparison values; and
comparing the one or more comparison values to the current SOH to provide a comparison result; and
determining if a safety condition exists based on the comparison result;
applying a first pressure to the battery system if the comparison result is normal;
applying a second pressure if the comparison result is not normal and no safety conditions exist;
applying a third pressure if the comparison result is not normal and no safety condition exists, and maintenance is required; or
de-pressurizing the battery system if the comparison result is not normal and a safety condition exists.

8. The method of claim 7, wherein calculating a current SOH comprises optimizing power performance wherein optimizing power performance comprises the steps of:
(i) determining a current pressure condition by sensing pressure of the battery cell;
(ii) comparing the current pressure condition with a threshold pressure value to provide a pressure comparison result;
(iii) determining whether a safety condition exists based on the pressure comparison result relative to the threshold pressure value;
(iv) determining whether the pressure comparison result is normal or not normal, and whether the normal or not normal condition further comprises a safety condition or no safety condition;

(v) applying a fourth pressure to the battery system if the pressure comparison result fails to exceed the threshold pressure value and is not normal and a safety condition does not exist;

(vi) depressurizing the battery system if the pressure comparison result exceeds the threshold pressure value and is not normal and a safety condition exists; or (vii) depressurizing the battery system if the pressure comparison result exceeds the threshold pressure value and is not normal.

9. The method of claim 7, wherein calculating a current SOH comprises factoring in an existing pressure.

10. The method of claim 7, wherein the battery metrics comprise voltage, OCV, voltage hysteresis, and impedance, or area-specific resistance (ASR), state-of-charge (SOC), battery history, and temperature.

11. The method of claim 10, wherein the ASR is a DC or series resistance.

12. The method of claim 7, further comprising changing the temperature of the battery system, comprising determining a temperature of a battery cell; and heating or cooling the battery cell.

13. The method of claim 7, further comprising reducing power availability if the comparison result is not normal and a safety condition exists by communicating an instruction to the driver to reduce power; communicating a control message to a controller to reduce power; or communicating a control message to a controller to reduce pressure on the electrochemical cell.

14. The method of claim 7, wherein the de-pressurizing results in a shutdown of the battery system.

15. The method of claim 14, further comprising one or more compressible elements and further comprising sending instructions to at least one member selected from the group consisting of a driver, an OEM, and a maintenance operator; wherein the instructions are for actuating one or more compressible elements to depressurize the battery system.

16. The method of claim 7, wherein applying the first pressure comprises sending a control message to at least one member selected from the group consisting of a driver, an OEM, a maintenance operator, an actuator, or a pressure transducer configured to apply pressure to the battery system.

17. The method of claim 7, wherein the condition is one selected from the group consisting of normal, abnormal, safe, non-safe, and shutdown, and combinations thereof.

18. The method of claim 17, wherein the condition is normal.

19. The method of claim 17, wherein the condition is safe.

20. The method of claim 17, wherein the condition is normal and safe.

21. The method of claim 17, wherein the condition is normal and non-safe.

22. The method of claim 17, wherein the condition is shutdown.

23. The method of claim 17, wherein the condition is abnormal and shutdown.

* * * * *